US012610688B2

(12) United States Patent
Ma

(10) Patent No.: US 12,610,688 B2
(45) Date of Patent: Apr. 21, 2026

(54) DISPLAY DEVICE

(71) Applicant: Samsung Display Co., LTD., Yongin-si (KR)

(72) Inventor: Jin Seock Ma, Hwaseong-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 687 days.

(21) Appl. No.: 17/873,599

(22) Filed: Jul. 26, 2022

(65) Prior Publication Data

US 2023/0209891 A1 Jun. 29, 2023

(30) Foreign Application Priority Data

Dec. 28, 2021 (KR) ........................ 10-2021-0189589

(51) Int. Cl.
| | |
|---|---|
| *H10K 59/121* | (2023.01) |
| *H10K 59/131* | (2023.01) |
| *H10K 59/80* | (2023.01) |
| *H10K 59/65* | (2023.01) |

(52) U.S. Cl.
CPC ......... *H10K 59/121* (2023.02); *H10K 59/131* (2023.02); *H10K 59/878* (2023.02); *H10K 59/65* (2023.02)

(58) Field of Classification Search
CPC . H10K 59/35; H01L 27/3244; H01L 27/3234; H01L 27/3227
See application file for complete search history.

(56) References Cited

U.S. PATENT DOCUMENTS 7,626,194 B2 * 12/2009 Han ..................... H10K 50/858
257/40
2004/0004224 A1 1/2004 Han
2004/0178722 A1 9/2004 Cok et al.
(Continued)

FOREIGN PATENT DOCUMENTS

| CN | 110706609 | 1/2020 |
|---|---|---|
| CN | 213519960 | 6/2021 |

(Continued)

OTHER PUBLICATIONS

Korean Office Action issued Oct. 27, 2025 in Korean Patent Application No. 10-2021-0189589.

*Primary Examiner* — Yuzhen Shen
(74) *Attorney, Agent, or Firm* — Harness, Dickey & Pierce, P.L.C.

(57) ABSTRACT

A display device includes: a first display area including a first pixel circuit portion and a first light emitting element electrically connected each other; a 2-1 display area including a 2-1 pixel circuit portion, a 2-1 light emitting element electrically connected each other, and a 2-2 pixel circuit portion; and a 2-2 display area including a 2-2 light emitting element electrically connected with the 2-2 pixel circuit portion, and a light transmissive area. The first pixel circuit portion is disposed lower than the first light emitting element in a cross-sectional view, and the 2-1 pixel circuit portion is disposed lower than the 2-1 light emitting element in a cross-sectional view. The 2-2 light emitting element includes a first electrode, an emission layer, and a second electrode, and the 2-2 display area includes a low reflective layer that overlaps the first electrode in a plan view.

18 Claims, 11 Drawing Sheets

(56)     References Cited

U.S. PATENT DOCUMENTS

| | | | | |
|---|---|---|---|---|
| 2007/0273279 | A1* | 11/2007 | Kobayashi | H10K 59/876 |
| | | | | 313/506 |
| 2015/0189211 | A1* | 7/2015 | Kokumai | H10F 39/18 |
| | | | | 348/301 |
| 2018/0081086 | A1* | 3/2018 | Wang | G02B 1/18 |
| 2021/0193758 | A1* | 6/2021 | Choi | H10K 59/123 |
| 2021/0223440 | A1* | 7/2021 | Wang | G02F 1/1368 |
| 2022/0037419 | A1 | 2/2022 | Ma et al. | |
| 2022/0336778 | A1* | 10/2022 | Kim | H10K 50/856 |
| 2022/0359633 | A1* | 11/2022 | Guo | H10K 50/865 |

FOREIGN PATENT DOCUMENTS

| | | |
|---|---|---|
| KR | 10-20060055052 A | 5/2006 |
| KR | 10-2021-0041892 | 4/2021 |
| KR | 10-2021-0069289 | 6/2021 |

* cited by examiner

FIG. 4

DISPLAY DEVICE

CROSS-REFERENCE TO RELATED APPLICATION(S)

This application claims priority to and the benefit of Korean Patent Application No. 10-2021-0189589 under 35 U.S.C. § 119, filed on Dec. 28, 2021, in the Korean Intellectual Property Office (KIPO), the disclosure of which is incorporated by reference herein in its entirety.

BACKGROUND

1. Technical Field

The disclosure relates to a display device, and more particularly, it relates to a display device in which an optical element such as a camera and the like can be positioned in a rear side of a display area.

2. Description of the Related Art

A display device is a display displaying a screen, and may include a liquid crystal display (LCD), an organic light emitting diode (OLED) display, and the like. The display device is used in various electronic devices such as portable phones, navigation devices, digital cameras, electronic books, portable game devices, or various terminals.

In particular, in small electronic devices such as portable phones, optical elements such as cameras and optical sensors are formed in the peripheral area, but the size of the display screen is increased and the size of the peripheral area is gradually reduced, and thus a technology that can place the camera or optical sensor on the rear side of the display area has been studied and developed.

The above information disclosed in this Background section is only for enhancement of understanding of the background of the disclosure, and therefore it may contain information that does not form the prior art that is already known in this country to a person of ordinary skill in the art.

SUMMARY

Embodiments are to provide a display device with improved display quality by reducing light reflection by an electrode of a metallic material while positioning an optical element such as a camera or an optical sensor on a rear surface of a light transmissive area of a display area. For example, embodiments are to provide a display device in which unnecessary reflection is reduced by a low reflection layer disposed on a light transmissive area even when an optical element such as a camera or an optical sensor is positioned on the rear surface of the light transmissive area of the display area.

A display device according to an embodiment may include: a first display area that includes a first pixel circuit portion and a first light emitting element electrically connected with the first pixel circuit portion; a 2-1 display area that includes a 2-1 pixel circuit portion, a 2-1 light emitting element electrically connected with the 2-1 pixel circuit portion, and a 2-2 pixel circuit portion; and a 2-2 display area that includes a 2-2 light emitting element electrically connected with the 2-2 pixel circuit portion, and a light transmissive area. The first pixel circuit portion of the first display area may be disposed lower than the first light emitting element in a cross-sectional view, and the 2-1 pixel circuit portion of the 2-1 display area may be disposed lower than the 2-1 light emitting element in a cross-sectional view. The 2-2 light emitting element may include a first electrode disposed in the 2-2 display area, an emission layer disposed in the 2-2 display area, and a second electrode disposed in the 2-2 display area, and the 2-2 display area may include a low reflective layer that overlaps the first electrode in a plan view.

The low reflective layer may contact the first electrode.

The low reflective layer may contact a bottom surface of the first electrode.

The low reflective layer may include at least one of metal, metal oxide, inorganic material, and amorphous silicon.

The low reflective layer may include at least one of molybdenum, molybdenum oxide, molybdenum tantalum oxide, molybdenum titanium oxide, silicon oxide, silicon nitride, silicon oxynitride, and amorphous silicon.

A reflectance of the low reflective layer may be lower than a reflectance of the first electrode.

A thickness of the low reflective layer may be in a range of about 50 angstroms to about 800 angstroms.

The low reflective layer may include a first sub-low reflective layer and a second sub-low reflective layer that are sequentially stacked each other.

The low reflective layer may further include a third sub-low reflective layer disposed on the second sub-low reflective layer.

A thickness of the first sub-low reflective layer may be in a range of about 10 angstroms to about 700 angstroms, and a thickness of the second sub-low reflective layer may be in a range of about 50 angstroms to about 800 angstroms.

A thickness of the third sub-low reflective layer may be in a range of about 50 angstroms to about 300 angstroms.

The 2-2 pixel circuit portion and the first electrode may be electrically connected through a transparent connection wire.

The transparent connection wire may be disposed throughout the 2-1 display area and the 2-2 display area.

Each of the first light emitting element, the 2-1 light emitting element, and the 2-2 light emitting element may include a function layer disposed between the first electrode and the second electrode, and the function layer may be disposed throughout the first display area, the 2-1 display area, and the 2-2 display area.

A display device according to an embodiment may include: a first display area that includes a first pixel circuit portion and a first light emitting element electrically connected with the first pixel circuit portion; a 2-1 display area that includes a 2-1 pixel circuit portion, a 2-1 light emitting element electrically connected with the 2-1 pixel circuit portion, and a 2-2 pixel circuit portion; and a 2-2 display area that includes a 2-2 light emitting element electrically connected with the 2-2 pixel circuit portion, a light transmissive area, and a low reflective layer. The 2-2 light emitting element may include a first electrode, an emission layer, and a second electrode. A reflectance of the low reflective layer may be lower than a reflectance of the first electrode.

The 2-2 display area may further include a substrate, an interlayer insulation layer extended from the 2-1 display area, and a transparent connection wire that is disposed on the interlayer insulation layer.

The low reflective layer may include at least one of metal, metal oxide, inorganic material, and amorphous silicon.

The low reflective layer may include at least one of molybdenum, molybdenum oxide, molybdenum tantalum oxide, molybdenum titanium oxide, silicon oxide, silicon nitride, silicon oxynitride, and amorphous silicon.

The low reflective layer may include a first sub-low reflective layer and a second sub-low reflective layer that are sequentially stacked each other.

The low reflective layer may further include a third sub-low reflective layer that is disposed on the second sub-low reflective layer.

According to the embodiments, an optical element such as a camera or an optical sensor may be positioned on the rear surface of the display area, and thus it is possible to display an image on the front surface of the display device. Further, according to the embodiments, it is possible to prevent the light reflected from the optical element from being reflected back in the light transmissive area and appearing as an image by positioning the low-reflective layer in the light transmissive area overlapping the optical element. Accordingly, it is possible to provide a display device with improved display quality.

BRIEF DESCRIPTION OF THE DRAWINGS

FIG. 4 is an enlarged view of a part of the second display area of the display device.

DETAILED DESCRIPTION OF THE EMBODIMENTS

Figure 1:
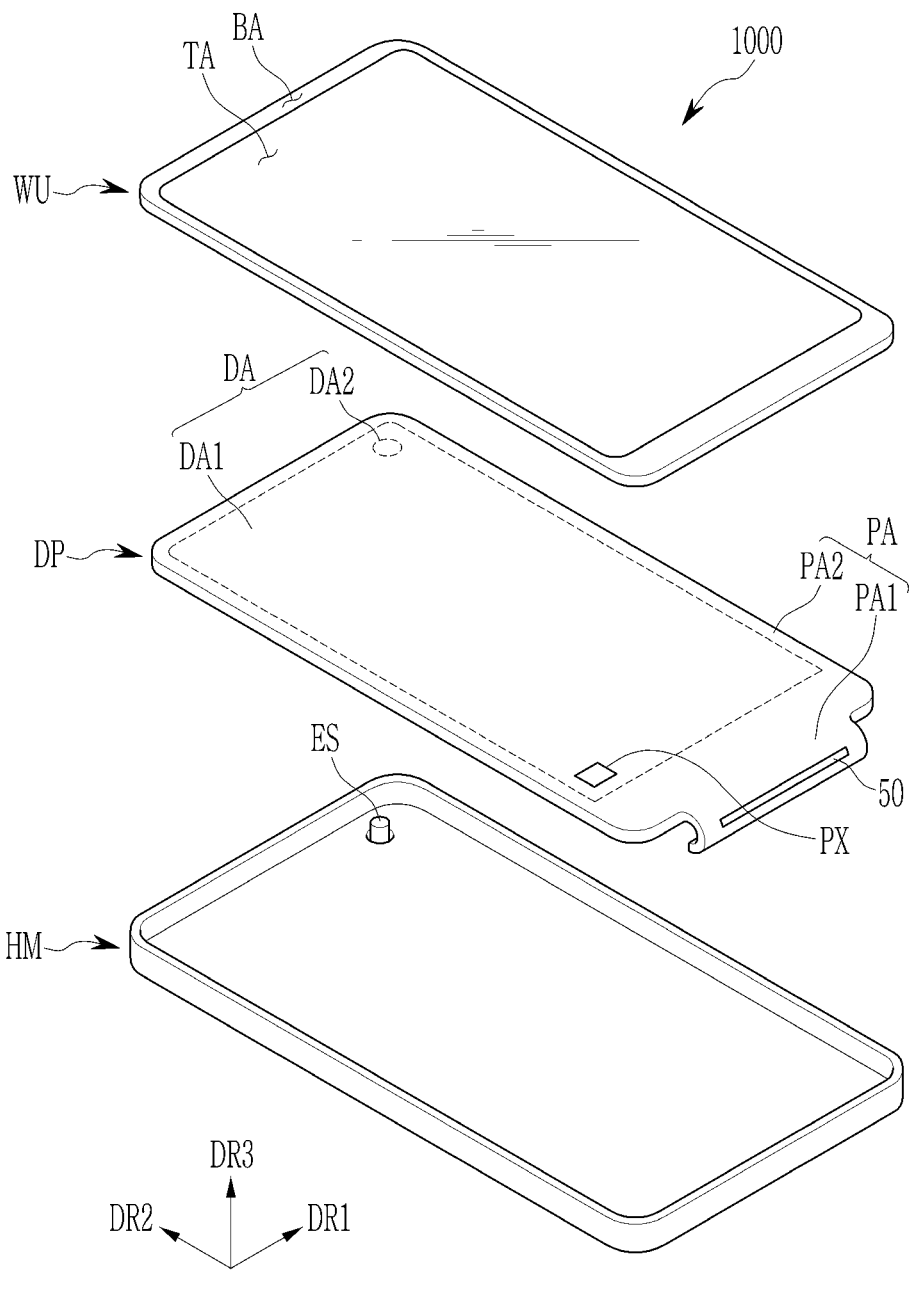
FIG. 1 is an exploded perspective view of a display device according to an embodiment.

The disclosure will be described more fully hereinafter with reference to the accompanying drawings, in which embodiments of the disclosure are shown. The disclosure may be implemented in several different forms and is not limited to the embodiments described herein.

The drawings and description are to be regarded as illustrative in nature and not restrictive. Like reference numerals designate like elements throughout the specification.

Since the size and thickness of each component shown in the drawing are arbitrarily indicated for better understanding and ease of description, the disclosure is not necessarily limited thereto. In the drawings, the thickness of layers, films, panels, regions, etc., are exaggerated for clarity. In the drawings, the thickness of layers, films, panels, regions, and the like are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

Unless explicitly described to the contrary, the word "comprise", and variations such as "comprises" or "comprising", will be understood to imply the inclusion of stated elements but not the exclusion of any other elements.

Further, throughout the specification, the phrase "in a plan view" means viewing a target portion from the top, and the phrase "on a cross-section" means viewing a cross-section formed by vertically cutting a target portion from the side.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Also, when an element is referred to as being "in contact" or "contacted" or the like to another element, the element may be in "electrical contact" or in "physical contact" with another element; or in "indirect contact" or in "direct contact" with another element.

Hereinafter, a schematic structure of a display device will be described with reference to FIG. 1. FIG. 1 is an exploded perspective view of a display device according to an embodiment.

Referring to FIG. 1, a display device 1000 according to an embodiment may be a display displaying motion pictures or still images, and may be used as a display screen of various products not only such as portable electronic devices including a mobile phone, a smart phone, a tablet personal computer, a mobile communication terminal, an electronic notebook, an electronic book, a portable multimedia player (PMP), a navigation device, an ultra mobile PC (UMPC), and the like, but also a television, a laptop, a monitor, an advertisement board, the Internet of things (IOT), and the like. The display device 1000 according to the embodiment may be used in a wearable device such as a smart watch, a watch phone, a spectacles type of display, and a head mounted display (HMD). The display device 1000 according to the embodiment may be used as an instrument panel of the car, the center fascia of the car or the center information display (CID) disposed on the dashboard, a room mirror display that replaces the side mirror of the car, or a display dispose on the back of the front seat of the car for entertainment. FIG. 1 illustrates a case that the display device 1000 is used as a smart phone for better comprehension and ease of description.

The display device 1000 may display an image on a display surface that is parallel to each of a first direction DR1 and a second direction DR2 toward a third direction DR3. The display surface on which the image is displayed may correspond to a front surface of the display device 1000 and may correspond to a front surface of a cover window WU. Images may include static images as well as dynamic images.

In the embodiment, the front (or top) and rear (or bottom) of each member are defined with reference to a direction in which the image is displayed. The front and rear surfaces may be opposite to each other in the third direction DR3, and the normal directions of the front and rear surfaces may be parallel to the third direction DR3. A separation distance in the third direction DR3 between the front and rear surfaces may correspond to a thickness in the third direction DR3 of a display panel.

The display device 1000 according to the embodiment may detect a user's input applied from the outside. The user's input may include various types of external inputs such as a part of the user's body, light, heat, or pressure. The user's input may be provided in various forms, and the display device 1000 may sense the user's input applied to the side or the rear surface of the display device 1000 according to the structure of the display device 1000.

The display device 1000 may include a cover window WU, a housing HM, a display panel DP, and an optical element ES. In the embodiment, the cover window WU and the housing HM may be combined to form the appearance of the display device 1000.

The cover window WU may include an insulation panel. For example, the cover window WU may be formed of glass, plastic, or a combination thereof.

The front of the cover window WU may define the front of the display device 1000. The transmissive area TA may be an optically transparent region. For example, the transmissive area TA may be a region having visible ray transmittance of about 90% or more.

A blocking area BA may define the shape of the transmissive area TA. The blocking area BA may be adjacent to the transmissive area TA and may surround the transmissive area TA. The blocking area BA may be a region having relatively low light transmittance compared to the transmissive area TA. The blocking area BA may include opaque material that blocks light. The blocking area BA may have a color. The blocking area BA may be defined by a bezel layer provided separately from the transparent substrate defining the transmissive area TA, or may be defined by an ink layer formed by inserting or coloring the transparent substrate.

The display panel DP may display an image and may further include a driver 50. The display panel DP may include a front surface including a display area DA and a non-display area PA. The display area DA may be a region in which a pixel operates according to an electrical signal and emits light.

In an embodiment, the display area DA may be a region in which pixels are included and an image is displayed, and simultaneously a region in which an external input is sensed by a touch sensor positioned on an upper side in the third direction DR3 of the pixel. The transmissive area TA of the cover window WU may at least partially overlap the display area DA of the display panel DP. For example, the transmissive area TA may overlap the front surface of the display area DA or may overlap at least a portion of the display area DA. Accordingly, the user may recognize an image through the transmissive area TA or provide external input based on the image. However, the disclosure is not limited thereto. For example, in the display area DA, a region where an image is displayed and a region where an external input is sensed may be separated from each other.

The non-display area PA of the display panel DP may at least partially overlap the blocking area BA of the cover window WU. The non-display area PA may be a region covered by the blocking area BA. The non-display area PA may be adjacent to the display area DA and may surround the display area DA. An image may be not displayed in the non-display area PA, and a driving circuit or driving wire for driving the display area DA may be disposed in the non-display area PA. The non-display area PA may include a driver 50, a first non-display area PA1 including a connecting wire and a bending region, and a second non-display area PA2 positioned outside the display area DA. In the embodiment of FIG. 1, the second non-display area PA2 may be positioned on three sides of the display area DA, and the first non-display area PA1 may be positioned on the other side of the display area DA.

In the embodiment, the display panel DP may be assembled in a flat state in which the display area DA and the non-display area PA face the cover window WU. However, the disclosure is not limited thereto. A part of the non-display area PA of the display panel DP may be bent. A portion of the non-display area PA may face the rear surface of the display device 1000, and thus the blocking area BA shown on the front surface of the display device 1000 may be reduced, and the first non-display area PA1 may be bent to be placed on the rear surface of the display area DA such that the display panel DP is assembled.

The display area DA may include a first display area DA1 and a second display area DA2.

In the first display area DA1, multiple light emitting elements, and multiple pixel circuit portions for generating and transmitting a light emitting current to each of the light emitting elements, may be formed. Here, one light emitting element and one pixel circuit portion may be referred to as a pixel PX. In the first display area DA1, one pixel circuit portion and one light emitting element may be formed on a one-to-one basis. The first display area DA1 may be hereinafter also referred to as a normal display area.

The second display area DA2 may be a region in which a component using infrared rays, visible rays, sound, and the like, may be disposed thereunder.

The driver 50 may be mounted on the first non-display area PA1, and may be mounted on the bending portion or positioned on one of both sides of the bending portion. The driver 50 may be provided in the form of a chip.

The driver 50 may be electrically connected to the display area DA to transmit an electrical signal to the display area DA. For example, the driver 50 may provide data signals to pixels PX disposed in the display area DA. In another example, the driver 50 may include a touch driving circuit and may be electrically connected to a touch sensor disposed in the display area DA. The driver 50 may include various circuits in addition to the above-described circuits or may be designed to provide various electrical signals to the display area DA.

The display device 1000 may have a pad portion positioned at the end of the first non-display area PA1, and may be electrically connected to a flexible printed circuit board (FPCB) including a driving chip on the pad portion. Here, the driving chip positioned on the flexible printed circuit board may include various driving circuits for driving the display device 1000 or connectors for power supply. Depending on embodiments, instead of the flexible printed circuit board, a rigid printed circuit board (PCB) may be used.

The optical element ES may be disposed under the display panel DP. The optical element ES may be an electronic element using light or sound. For example, the optical element ES may be a sensor that receives and uses light such as an infrared sensor, a sensor that outputs and senses light or sound to measure a distance or recognizes a fingerprint, and the like, a small lamp that outputs light, a speaker that outputs sound, and the like. In the case of an electronic element using light, light of various wavelength bands such as visible light, infrared light, and ultraviolet (UV) light may be used. In other embodiments, the optical element ES may be at least one of a camera, an infrared (IR) camera, a dot projector, an infrared illuminator, and a time-of-flight (ToF) sensor.

The housing HM may be combined with a cover window WU. The cover window WU may be disposed on the entire housing HM. The housing HM may be combined with the cover window WU to provide an accommodation space. The display panel DP and the optical element ES may be accommodated in the accommodation space provided between the housing HM and the cover window WU.

The housing HM may contain a material with relatively high stiffness. For example, the housing HM may include multiple frames and/or plates made of glass, plastic, or metal, or a combination thereof. The housing HM may reliably protect the components of the display device 1000 accommodated in the inner space from external impact.

Figure 2:
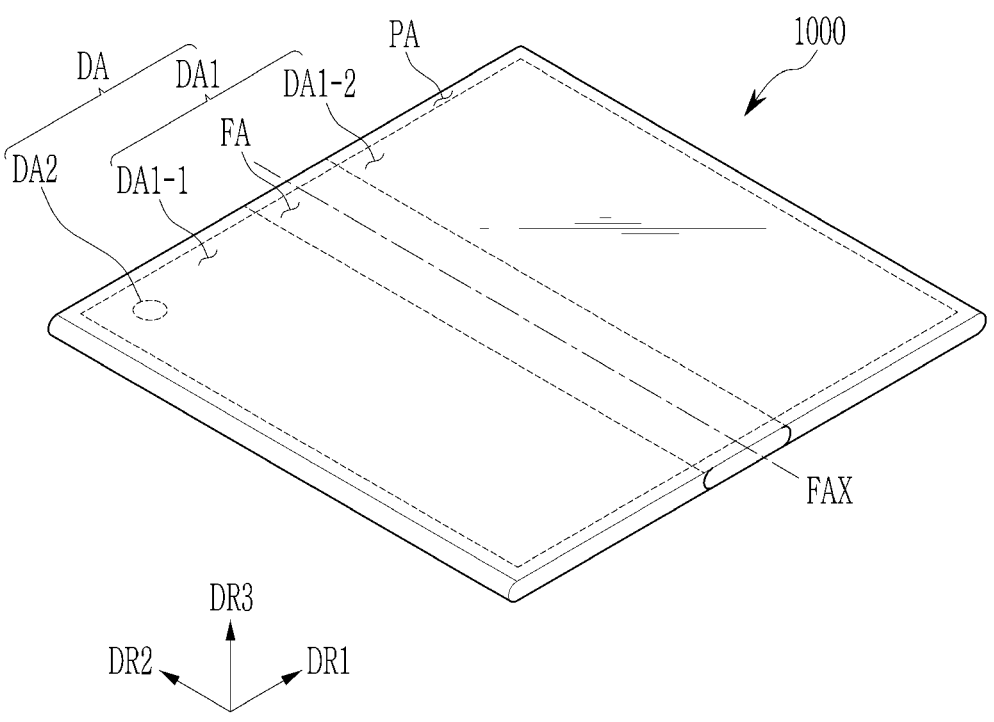
FIG. 2 is a schematic perspective view of a display device according to another embodiment.

Hereinafter, a display device 1000 according to another embodiment will be described with reference to FIG. 2. FIG. 2 is a schematic perspective view of a display device according to another embodiment. A description of constituent elements that are the same as the above-described configuration will be omitted.

In an embodiment of FIG. 2, a foldable display device with a structure in which a display device 1000 may be folded along a folding axis FAX is illustrated.

Referring to FIG. 2, a display device 1000 may be a foldable display device in the embodiment. The display device 1000 may be folded outward or inward with reference to the folding axis FAX. In case of folding at the folding axis FAX as a reference, a display surface of the display device 1000 may be positioned on the outside in the third direction DR3, and thus images may be displayed in both directions. In case that the folding axis FAX is folded inward as a reference, the display surface may not be visible from the outside.

In the embodiment, the display device 1000 may include a display area DA and a non-display area PA. The display area DA may be divided into a 1-1 display area DA1-1, a 1-2 display area DA1-2, a second display area DA2, and a folding area FA. The 1-1 display area DA1-1 and the 1-2 display area DA1-2 may be positioned on the left and right sides, respectively, of the folding axis FAX as a reference (or at the center), and the folding area FA may be positioned between the 1-1 display area DA1-1 and the 1-2 display areas DA1-2. In case that the display area DA is folded outward with reference to the folding axis FAX, the 1-1 display area DA1-1 and the 1-2 display area DA1-2 may be positioned on both sides in the third direction DR3, and images may be displayed in both directions. In case that the display area DA is folded inward with reference to the folding axis FAX, the 1-1 display area DA1-1 and the 1-2 display area DA1-2 may not be visible from the outside while folded.

Figure 3:
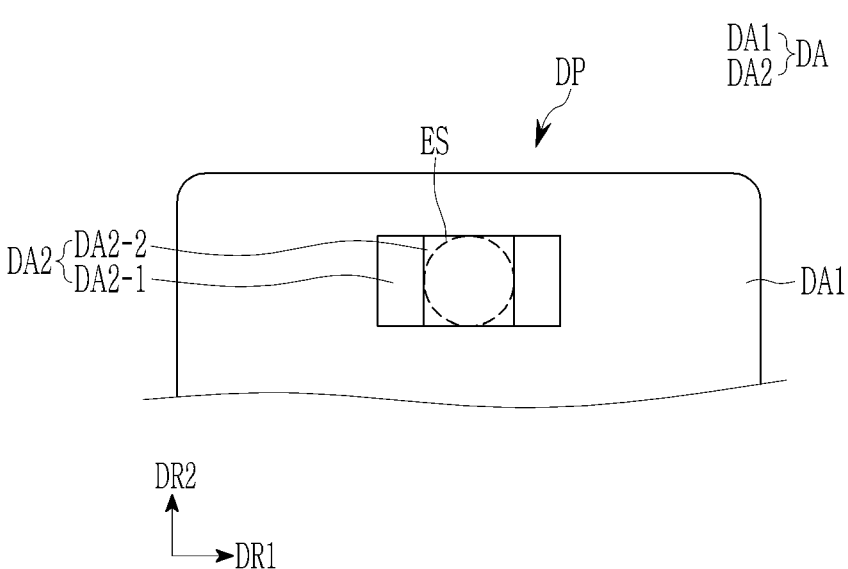
FIG. 3 is an enlarged top plan view of some area of the display device according to an embodiment.
Figure 4:
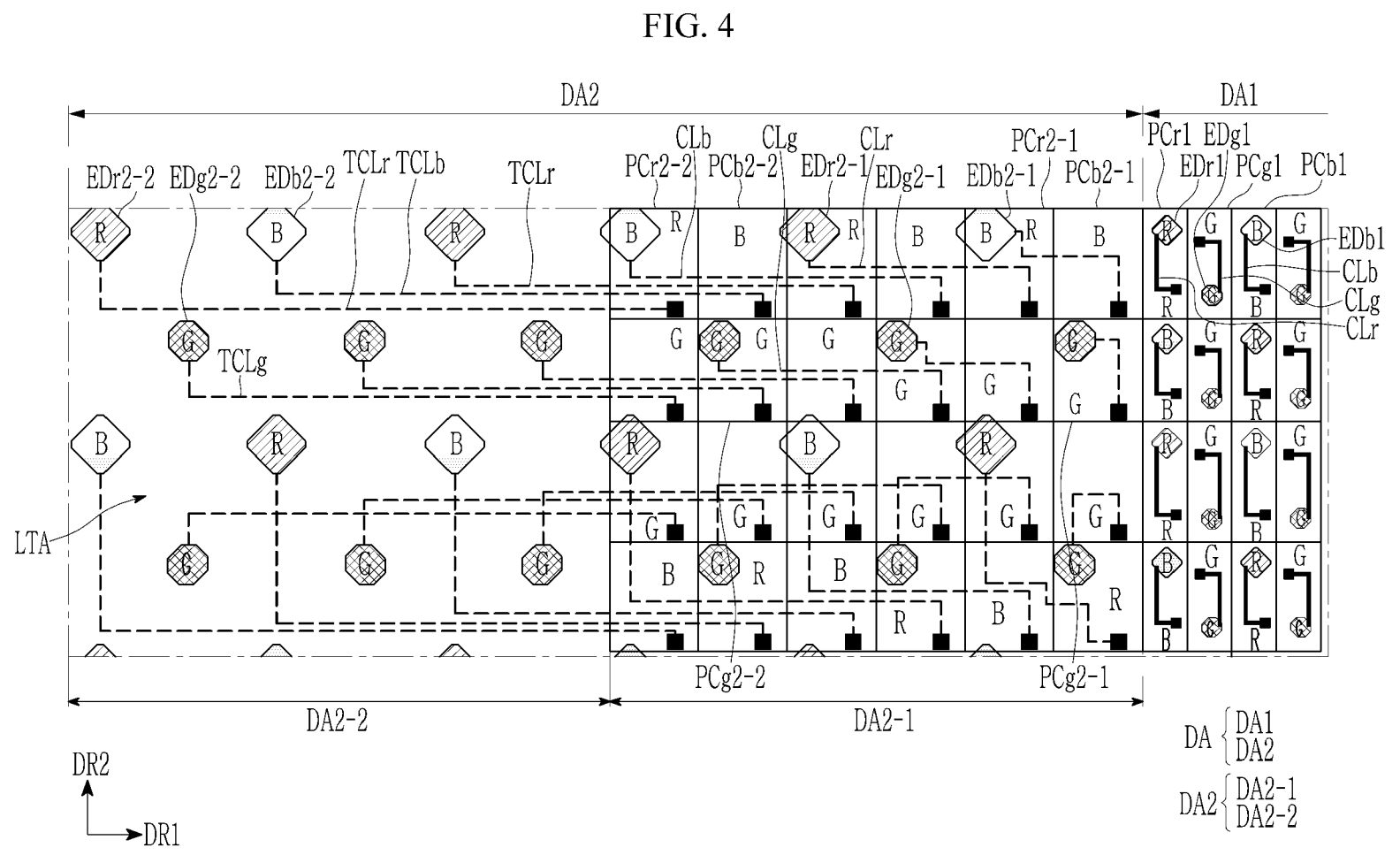
Figure 5:
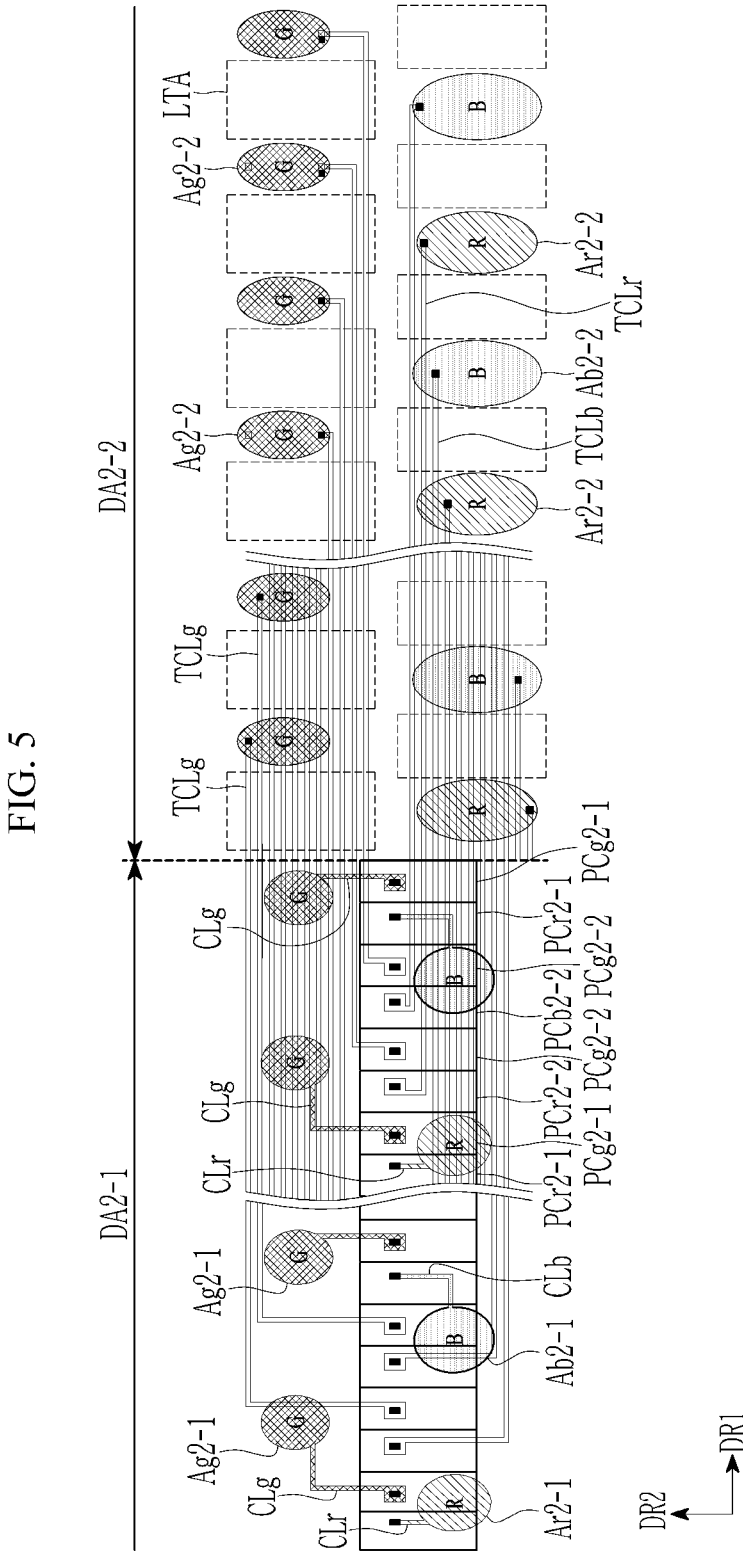
FIG. 5 is an enlarged view of the second display area of the display device.

Hereinafter, the display area according to the embodiment will be described with reference to FIG. 3 to FIG. 5. FIG. 3 is an enlarged top plan view of some area of the display device according to an embodiment, FIG. 4 is an enlarged view of a part of the second display area of the display device, and FIG. 5 is an enlarged view of the second display area of the display device.

Referring to FIG. 3, the display area DA may be disposed on the entire surface of the display panel DP, and the display area DA may be divided into a first display area DA1 and a second display area DA2. In FIG. 3, a structure of the display panel DP below the cut-line is not illustrated, but the first display area DA1 may be positioned below the cut-line.

An optical element ES, such as a camera or an optical sensor, may be positioned on the rear side of the display panel DP, and in FIG. 3, the optical element ES may be positioned on the rear side and is shown as a dotted line.

The second display area DA2 may be positioned in front of and around the optical element ES. The second display area DA2 may be divided into a 2-1 display area DA2-1 and a 2-2 display area DA2-2.

The 2-2 display area DA2-2 may be a display area positioned on the entire surface of the optical element ES. The 2-2 display area DA2-2 may include multiple light emitting elements and may display an image, but a pixel circuit portion for generating and transmitting a light emitting current to the light emitting elements may be not formed in the 2-2 display area DA2-2 but may be located in an adjacent 2-1 display area DA2-1. The pixel circuit portion positioned in the 2-1 display area DA2-1 and the light emitting element positioned in the 2-2 display area DA2-2 may be electrically connected through a transparent connection wire. In the 2-2 display area DA2-2, a transparent light transmissive area may be formed in a region other than a region where multiple light emitting elements are positioned, and a camera or optical sensor, which is the optical element ES, may be installed on the display panel to shoot or detect an object positioned in front of the display panel DP through the light transmissive area. In FIG. 3, the 2-2 display area DA2-2 is illustrated as a quadrangle. However, the 2-2 display area DA2-2 may have a shape corresponding to a planar shape of the optical element ES, such as a circle, depending on embodiments. Hereinafter, the 2-2 display area DA2-2 may be also referred to as a transparent display area.

The 2-1 display area DA2-1 may be positioned on one side or both sides of the 2-2 display area DA2-2, and may be positioned between the first display area DA1 and the 2-2 display area DA2-2. In the 2-1 display area DA2-1, one pixel circuit portion and one light emitting element may be formed one-to-one, and the 2-1 display area DA2-1 may further include a pixel circuit portion for transmitting a light emitting current to the multiple light emitting elements formed in the 2-2 display area DA2-2. Hereinafter, the 2-1 display area DA2-1 may be also referred to as an intermediate display area.

FIG. 3 illustrates an embodiment in which the 2-1 display areas DA2-1 are positioned at the left and right of the 2-2 display area DA2-2, and a horizontal width of a single 2-1 display area DA2-1 may be half of a horizontal width of the 2-2 display area DA2-2. The first display area DA1 may be positioned in a region where the 2-1 display area DA2-1 is not positioned, which is a region adjacent to the 2-2 display area DA2-2. With reference to the 2-2 display area DA2-2, the direction in which the 2-1 display area DA2-1 is positioned may coincide with an extension direction (first direction) of a scan line, which will be described later. A transparent connection wire formed in the second display area DA2 may extend from the 2-1 display area DA2-1 to the 2-2 display area DA2-2.

FIG. 4 illustrates an arrangement and a connection structure of a pixel circuit portion and a light emitting element that form the first display area DA1 (i.e., the normal display area), the 2-1 display area DA2-1 (i.e., the intermediate display area), and the 2-2 display area DA2-2 (i.e., the transparent display area) according to the embodiment.

First, the first display area DA1 (normal display area) may include multiple light emitting elements EDr1, EDg1, and EDb1 (hereinafter also referred to as light emitting elements for a normal display area) and multiple pixel circuit portions PCr1, PCg1, and PCb1 (hereinafter also referred to as pixel circuit portions for a normal display area), and they may be formed in the same number. In FIG. 4, the pixel circuit portions PCr1, PCg1, and PCb1 of the first display area are simply illustrated as squares having a rectangular shape, and the multiple light emitting elements EDr1, EDg1, and EDb1 are illustrated in a rhombus or octagonal shape, however, the disclosure is not limited thereto. The multiple light emitting elements EDr1, EDg1, and EDb1 may be positioned on a front (or upper side) of each of the connected pixel circuit portions PCr1, PCg1, and PCb1 to overlap the pixel circuit portions PCr1, PCg1, and PCb1 in a plan view. Connecting portions CLr, CLg, and CLb extended from multiple light emitting elements EDr1, EDg1, and EDb1 are also illustrated to show which multiple light emitting elements EDr1, EDg1, and EDb1 are electrically connected to the pixel circuit portions PCr1, PCg1, and PCb1. The multiple light emitting elements EDr1, EDg1, and EDb1 may each include a first electrode, an emission layer, and a second electrode. The planar shape of the light emitting element is not limited to the shape of a rhombus or hexagon shown in FIG. 4, and it may have various shapes such as a circle and a hexagon. Here, the connecting portions CLr, CLg, and CLb may be formed of a transparent conductive material or may be formed of a non-transparent conductive material such as metal.

In the embodiment of FIG. 4, four pixels are used as unit pixels and are arranged repeatedly. Four pixels forming one unit pixel may be formed of one red pixel, one blue pixel, and two green pixels. However, depending on embodiments, at least one red pixel, at least one green pixel, and at least one blue pixel may be included. In the embodiment shown in FIG. 4, the positions of red light emitting elements EDr1 and blue light emitting elements EDb1 are changed for each row. However, numerous variations are possible in the number and arrangement of pixels or light emitting elements.

In the second display area DA2, multiple pixel circuit portions PCr2-1, PCr2-2, PCg2-1, PCg2-2, PCb2-1, and PCb2-2 and multiple light emitting elements EDr2-1, EDg2-1, and EDb2-1 may be positioned in the 2-1 display area DA2-1 (intermediate display area). The multiple pixel circuit portions PCr2-1, PCr2-2, PCg2-1, PCg2-2, PCb2-1, and PCb2-2 of the 2-1 display area DA2-1 (intermediate display area) may be divided into pixel circuit portions PCr2-1, PCg2-1, and PCb2-1 for the 2-1 display area (hereinafter, also referred to as pixel circuit portions for the intermediate display area) and pixel circuit portions PCr2-2, PCg2-2, and PCb2-2 for the 2-2 display area (hereinafter, also referred to as pixel circuit portions for the transparent display area). The pixel circuit portions PCr2-1, PCg2-1, and PCb2-1 for the 2-1 display area may be pixel circuit portions that transmit a light emitting current to multiple light emitting elements EDr2-1, EDg2-1, and EDb2-1 disposed in the 2-1 display area DA2-1 (intermediate display area) (also referred to as light emitting elements for the intermediate display area). The pixel circuit portions PCr2-1, PCg2-1, and PCb2-1 for the 2-1 display area and the light emitting elements EDr2-1, EDg2-1, and EDb2-1 for the 2-1 display area may correspond one-to-one.

Although the pixel circuit portions PCr2-2, PCg2-2, and PCb2-2 for the 2-2 display area are positioned in the 2-1 display area DA2-1 (intermediate display area), they may generate a light emitting current to be transmitted to the light emitting elements EDr2-2, EDg2-2, and EDb2-2 for the 2-2 display area disposed in the 2-2 display area DA2-2 (transparent display area).

The pixel circuit portions PCr2-1, PCg2-1, and PCb2-1 for the 2-1 display area and the pixel circuit portions PCr2-2, PCg2-2, and PCb2-2 for the 2-2 display area may have the same planar structure and circuit structure except for structures electrically connected to the light emitting element.

In the embodiment of FIG. 4, three pixel circuit portions PCr2-1, PCg2-1, and PCb2-1 for the 2-1 display area are formed consecutively in the first direction DR1, and three pixel circuit portions PCr2-2, PCg2-2, PCb2-2 for the 2-2 display area are positioned close to the 2-2 display area DA2-2. Only the red and blue pixel circuit portions may be positioned in a row, and only the green pixel circuit portions may be positioned in another row. Depending on embodiments, the pixel circuit portions PCr2-1, PCg2-1, and PCb2-1 for the 2-1 display area and the pixel circuit portions PCr2-2, PCg2-2, and PCb2-2 for the 2-2 display area may be alternately disposed. Depending on embodiments, they may be arranged the same as the pixel arrangement of the first display area DA1. The arrangement and number of the pixel circuit portions may vary depending on embodiments.

No pixel circuit portion may be formed in the 2-2 display area DA2-2 (transparent display area), and the light emitting elements EDr2-2, EDg2-2, and EDb2-2 for the 2-2 display area (hereinafter, also referred to as light emitting elements for a transparent display area), transparent connection wires TCLr, TCLg, and TCLb, and a light transmissive area LTA may be formed in the 2-2 display area DA2-2.

In FIG. 4, the light emitting elements EDr2-2, EDg2-2, and EDb2-2 for the 2-2 display area and the transparent connection wires TCLr, TCLg, and TCLb in the 2-2 display area DA2-2 (transparent display area) are illustrated, and a portion where nothing is illustrated corresponds to the light transmissive area LTA.

One light emitting element (EDr2-2, EDg2-2, and EDb2-2) for the 2-2 display area may be electrically connected with one pixel circuit portion (PCr2-2, PCg2-2, and PCb2-2) for the 2-2 display area disposed in the 2-1 display area DA2-1 through one transparent connection wire (TCLr, TCLg, and TCLb). The transparent connection wires TCLr, TCLg, and TCLb may be electrically connected with the pixel circuit portions PCr2-2, PCg2-2, and PCb2-2 for the 2-2 display area positioned in the 2-1 display area DA2-1 (intermediate display area) and thus may receive a light emitting current and may transmit the light emitting current to the light emitting elements EDr2-2, EDg2-2, and EDb2-2 for the 2-2 display area. The transparent connection wires TCLr, TCLg, and TCLb may be formed of a transparent conductive material such that a transparent region of the 2-2 display area DA2-2 (transparent display area) may be increased and light transmittance of the 2-2 display area DA2-2 may be increased. Due to such a structure, photographing or detecting performance of an optical element ES on the rear side of the 2-2 display area DA2-2 (transparent display area) may be improved. Depending on embodiments, the transparent connection wires TCLr, TCLg, and TCLb may be formed of an opaque metal in the 2-1 display area DA2-1, and may be formed of a transparent conductive material only in the 2-2 display area DA2-2 (transparent display area).

In the embodiment of FIG. 4, the 2-1 display area DA2-1 (intermediate display area) is positioned between the first display area DA1 and the 2-2 display area DA2-2 (transparent display area) in the first direction DR1. For example, the first display area DA1 (normal display area), the 2-1 display area DA2-1 (intermediate display area), and the 2-2 display area DA2-2 (transparent display area) may be sequentially positioned along the first direction DR1.

Depending on embodiments, a wire (scan lines or initialization control lines, etc.) required in the 2-1 display area DA2-1 (intermediate display area) or the first display area DA1 (normal display area) may pass through the 2-2 display area DA2-2 (transparent display area). The passing wire may include a transparent conductive material, and may be formed of a non-transparent metal depending on embodiments. Depending on embodiments, the passing wire may be positioned along an outer edge of the 2-2 display area DA2-2 (transparent display area).

In FIG. 4, the pixel circuit portions PCr2-1, PCr2-2, PCg2-1, PCg2-2, PCb2-1, and PCb2-2 positioned in the second display area DA2 are illustrated twice as large as the pixel circuit portions PCr1, PCg1, and PCb1 positioned in the first display area DA1 in the first direction DR1, and thus the area is illustrated as doubled. As described above, in case that the area occupied by the pixel circuit portion is large, the size of a transistor such as a driving transistor positioned inside the pixel circuit portion (a channel width or length) or a capacitor size (capacitance size) may be also formed large. Accordingly, the intensity of the output current from the pixel circuit portion may be also large. In FIG. 4, the light emitting elements EDr2-1, EDg2-1, EDb2-1, EDr2-2, EDg2-2, and EDb2-2 positioned in the second display area DA2 are also illustrated large compared to the light emitting elements EDr1, EDb1, and EDg1 positioned in the first display area DA1. In case that the light emitting element is large, the output current to drive it also may need to be large. Therefore, to drive the larger light emitting elements EDr2-1, EDg2-1, EDb2-1, EDr2-2, EDg2-2, and EDb2-2 positioned in the second display area DA2, the pixel circuit portions PCr2-1, PCr2)-2, PCg2-1, PCg2-2, PCb2-1, and PCb2-2 may be also formed to be large to generate a large output current. In the embodiment shown in FIG. 6, multiple light emitting elements may be electrically connected to each pixel circuit portion of the second display area DA2, and the size of the light emitting element and the size of the light emitting element of the first display area DA1 may be the same. As described above, unlike the first display area DA1, multiple light emitting elements may be electrically connected to the pixel circuit portion of the second display area DA2 to form a large pixel circuit portion to transmit the output current to the multiple light emitting elements. The area of the pixel circuit portion of the second display area DA2 may be formed to be 4 times larger than the area of the pixel circuit portion of the first display area DA1, and the difference in the area may vary depending on embodiments.

According to the embodiment of FIG. 4, with reference to the unit area, the sum of the number of pixel circuit portions PCr2-1, PCg2-1, and PCb2-1 for the 2-1 display area and the number of the pixel circuit portions PCr2-2, PCg2-2, and PCb2-2 for the 2-2 display area positioned in the 2-1 display area DA2-1 (intermediate display area) may be formed to be half the number of the pixel circuit portions PCr1, PCg1, and PCb1 positioned in the first display area DA1 (normal display area). Since the number of the 2-1 pixel circuit portions PCr2-1, PCg2-1, and PCb2-1 for the 2-1 display area and the number of the pixel circuit portions PCr2-2, PCg2-2, and PCb2-2 for the 2-2 display area positioned in the display area DA2-1 (intermediate display area) may be the same, the number of light emitting elements positioned in the 2-1 display area DA2-1 (intermediate display area) or the number of the 2-2 display area DA2-2 (transparent display area) may be ¼ of the number of light emitting elements positioned in the first display area DA1 (normal display area). Therefore, the number of pixels per inch (PPI) value of the pixels positioned in the second display area DA2 may be smaller than the number of pixels per inch (PPI) value of the pixel formed in the first display area DA1. As such, with reference to the unit area, in case that the number of light emitting elements in the second display area DA2 is smaller than the number of light emitting elements in the first display area DA1, the area of the light emitting elements in the second display area DA2 may be formed larger than the area of the light emitting element the first display area DA1.

Depending on embodiments, with reference to the unit area, the sum of the number of pixel circuit portions PCr2-1, PCg2-1, and PCb2-1 for the 2-1 display area and the number of pixel circuit portions PCr2-2, PCg2-2, and PCb2-2 for the 2-2 display area positioned in the 2-1 display area DA2-1 (intermediate display area) may be the same as the number of pixel circuit portions PCr1, PCg1, and PCb1 positioned in the first display area DA1 (normal display area). With reference to the unit area, the number of light emitting elements positioned in the 2-1 display area DA2-1 (intermediate display area) or the number of the 2-2 display area DA2-2 (transparent display area) may be ½ of the number of light emitting elements positioned in the display area DA1 (normal display area). Depending on embodiments, the number of light emitting elements positioned in the 2-1 display area DA2-1 (intermediate display area) or the number of the 2-2 display area DA2-2 (transparent display area) may be different, and the ratio of the number of light emitting elements between areas may also vary for each display area. Depending on embodiments, the number of pixels per inch (PPI) value of the pixels formed in the first display area DA1 and the number of pixels per inch (PPI) value of the pixels formed in the second display area DA2 may be formed identically by forming multiple light emitting elements electrically connected to one pixel circuit portion in the second display area DA2. In the case of having the same number of pixels per inch (PPI) as described above, the size of the light emitting element of the second display area DA2 and the size of the light emitting element of the first display area DA1 may be formed to be the same.

Hereinabove, the structure of the first display area DA1 and the second display area DA2 has been described in detail with reference to FIG. 4.

In FIG. 5, unlike FIG. 4, an embodiment that the 2-2 display area DA2-2 (transparent display area) is positioned to the right of the 2-1 display area DA2-1 (the middle display area) is shown. For reference, a structure that is symmetric to the left and right of the structure shown in FIG. 4 and FIG. 5 may be further formed on the opposite side.

Unlike FIG. 4, FIG. 5 illustrates first electrodes Ar2-1, Ag2-1, Ab2-1, Ar2-2, Ag2-2, and Ab2-2 forming the light emitting element. The first electrodes Ar2-1, Ag2-1, Ab2-1, Ar2-2, Ag2-2, and Ab2-2 may be divided into the first electrodes Ar2-1, Ag2-1, and Ab2-1 for the 2-1 display area and the first electrodes Ar2-2, Ag2-2, and Ab2-2 for the 2-2 display area.

In case that eight pixel circuit portions formed of four pixel circuit portions PCr2-1, PCg2-1, and PCb2-1 for the 2-1 display area and four pixel circuit portions PCr2-2, PCg2-2, and PCb2-2 for the 2-2 display area in the 2-1 display area DA2-1 are referred to as a unit pixel circuit portion, a total of two unit pixel circuit portions are illustrated in FIG. 5. Here, four pixel circuit portions PCr2-1, PCg2-1, and PCb2-1 for the 2-1 display area and four pixel circuit portions PCr2-2, PCg2-2, and PCb2-2 for the 2-2 display area each may be respectively formed of one red pixel circuit portion (PCr2-1 and PCr2-2), one blue pixel circuit portion (PCb2-1 and PCb2-2), and two green pixel circuit portions PCg2-1 and PCg2-2. A broken line is shown between the two unit pixel circuit portions in FIG. 5, they are not unit pixel circuit portions positioned adjacent to each other, and the two unit pixel circuit portions shown in FIG. 5 may be unit pixel circuit portions positioned at the most outer sides of the 2-1 display area DA2-1.

In FIG. 5, in the 2-1 display area DA2-1, the first electrodes Ar2-1, Ag2-1, and Ab2-1 for the 2-1 display area, respectively electrically connected to the pixel circuit portions PCr2-1, PCg2-1, and PCb2-1 for the 2-1 display area may be positioned, and connection portions CLr, CLg, and CLb that respectively electrically connect the pixel circuit portions PCr2-1, PCg2-1, and PCb2-1 for the 2-1 display area and the first electrodes Ar2-1, Ag2-1, and Ab2-1 for the 2-1 display area may be formed.

In the 2-1 display area DA2-1 of FIG. 5, transparent connection wires TCLr, TCLg, and TCLb that extend from the pixel circuit portions PCr2-2, PCg2-2, and PCb2-2 for the 2-2 display area to the first electrodes Ar2-2, Ag2-2, and Ab2-2 for the 2-2 display area positioned in the 2-2 display area DA2-2 may be partially positioned.

Here, the connection portions CLr, CLg, and CLb may be formed of a transparent conductive material or an opaque conductive material such as metal, and the transparent connection wires TCLr, TCLg, and TCLb may be formed of a transparent conductive material. Depending on embodiments, the transparent connection wires TCLr, TCLg, and TCLb may be formed of an opaque metal in the 2-1 display area DA2-1, and may be formed of a transparent conductive material only in the 2-2 display area DA2-2 (transparent display area). In other embodiments, they may be provided as a general opaque connection wire instead of transparent connection wires TCLr, TCLg, and TCLb.

In the first electrodes Ar2-1, Ag2-1, and Ab2-1 for the 2-1 display area illustrated in the 2-1 display area DA2-1 of FIG. 5, in case that one red first electrode Ar2-1, one blue first electrode Ab2-1, and two green first electrodes Ag2-1 form a unit first electrode, two unit first electrodes are illustrated. Hereinafter, the unit first electrode may be also referred to as a unit light emitting element.

In the embodiment of FIG. 5, the first electrodes Ar2-1 and Ab2-1 for the 2-1 display area of red and blue may be positioned to at least partially overlapping the pixel circuit portions PCr2-1, PCg2-1, and PCb2-1 for the 2-1 display area in a plan view, and the first electrode Ag2-1 for the 2-1 display area of green may overlap the transparent connection wires TCLr, TCLg, and TCLb in a plan view while not overlapping the pixel circuit portions PCr2-1, PCg2-1, and PCb2-1 for the 2-1 display area in a plan view. However, the light emitting element may be positioned differently.

In in the 2-2 display area DA2-2 shown in FIG. 5, the transparent connection wires TCLr, TCLg, and TCLb electrically connected with the first electrodes Ar2-2, Ag2-2, and Ab2-2 for the 2-2 display area and the first electrodes Ar2-2, Ag2-2, and Ab2-2 for the 2-2 display area, and the light transmissive area LTA, may be positioned.

In the first electrodes Ar2-2, Ag2-2, and Ab2-2 for the 2-2 display area shown in the 2-2 display area DA2-2 of FIG. 5, one red first electrode Ar2-2, one blue first electrode Ab2-2, and two green first electrodes Ag2-2 form a unit first electrode, and three unit first electrodes are illustrated. A broken line is illustrated between three unit first electrodes shown in the 2-2 display area DA2-2 of FIG. 5, two unit first electrodes, respectively positioned at the leftmost and at the most central part of the display area DA2-2 are shown.

The transparent connection wires TCLr, TCLg, and TCLb extending from the 2-1 display area DA2-1 may be positioned in the 2-2 display area DA2-2. At least a part of the first electrodes Ar2-2, Ag2-2, and Ab2-2 for the 2-2 display area positioned in the 2-2 display area DA2-2 may overlap the transparent connection wires TCLr, TCLg, and TCLb in a plan view.

In FIG. 5, the light transmissive area LTA is illustrated in the shape of a quadrangle by a dotted line, but, in actuality, in the 2-2 display area DA2-2, all parts through which light can be transmitted may be included, and the entire 2-2 display area DA2-2 may be the light transmissive area LTA except for a region in which the first electrodes Ar2-2, Ag2-2, and Ab2-2 for the 2-2 display area are positioned.

The first electrodes Ar2-2, Ag2-2, and Ab2-2 for the 2-2 display area may have the same arrangement as the first electrodes Ar2-1, Ag2-1, and Ab2-1 for the 2-1 display area. For example, only green light emitting elements may be positioned in one row, and red and blue light emitting elements may be alternately positioned in another row.

Referring to FIG. 5, the first electrodes Ar2-2, Ag2-2, and Ab2-2 for the 2-2 display may be formed larger than the first electrodes Ar2-1, Ag2-1, and Ab2-1 for the 2-1 display area. However, depending on embodiments, the two light emitting elements may have the same size as each other.

Figure 6:
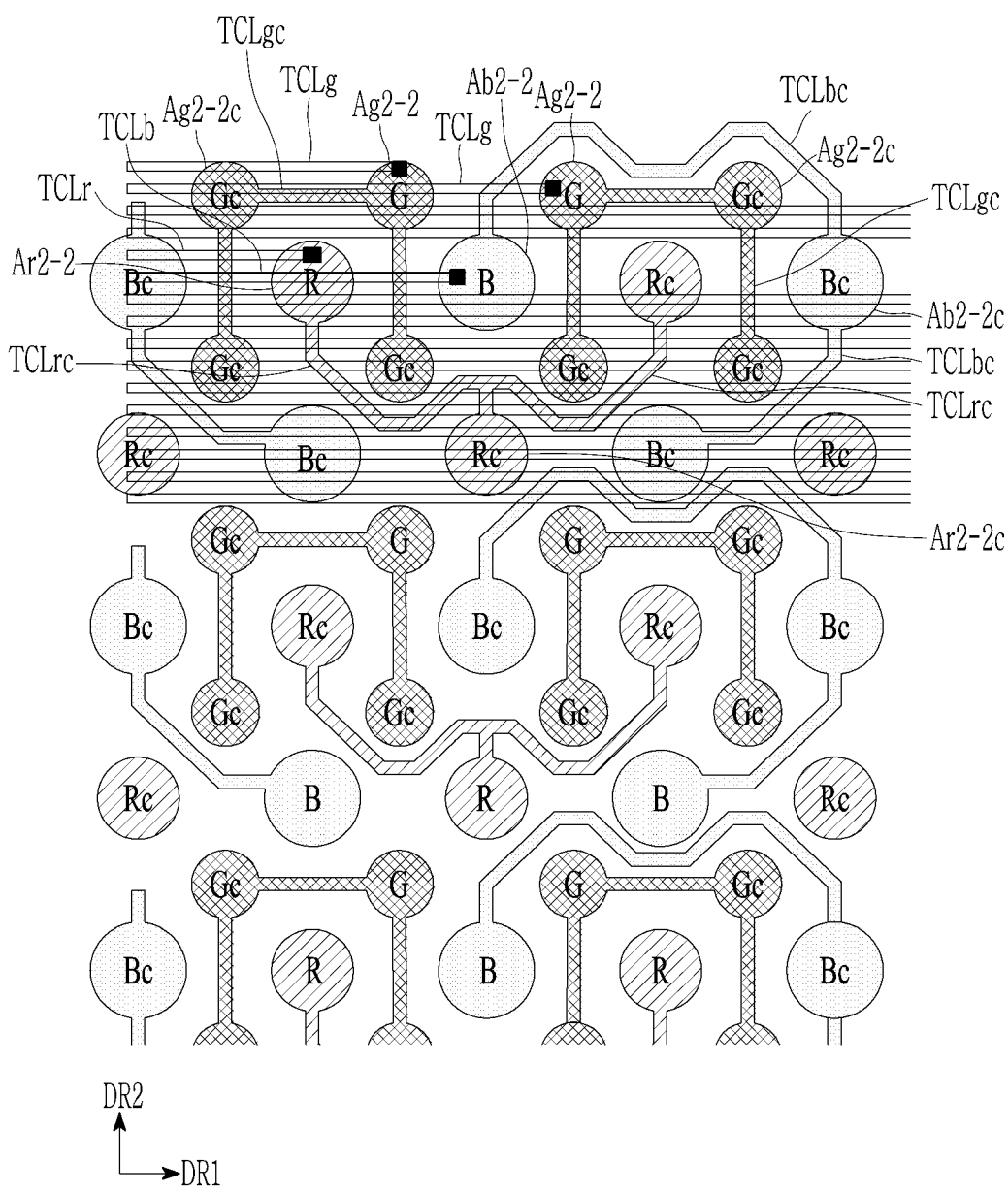
FIG. 6 is an enlarged view of a part of the second display area in the display device according to the embodiment.

Hereinafter, referring to FIG. 6, an embodiment in which multiple light emitting elements or first electrodes are electrically connected to one pixel circuit portion will be described. FIG. 6 is an enlarged view of a part of the second display area in the display device according to the embodiment.

In FIG. 6, only the 2-2 display area DA2-2 is illustrated, and the same first electrode arrangement may also be formed in the 2-1 display area DA2-1 depending on embodiments.

Hereinafter, an embodiment in which a first electrode of each color is formed of a unit color first electrode formed of multiple first electrodes will be described.

In the 2-2 display area DA2-2 of FIG. 6, each unit color first electrode including multiple first electrodes electrically connected to each other may be formed. Each unit color first electrode may be formed of one first electrode that is directly connected with the transparent connection wires TCLr, TCLg, and TCLb and other copy first electrodes Ar2-2c, Ag2-2c, and Ab2-2c that are electrically connected with one first electrode (Ar2-2, Ag2-2, and Ab2-2) (hereinafter, also referred to as a main first electrode). In the embodiment of FIG. 6, unit color first electrodes Ar2-2, Ar2-2c, Ab2-2, and Ab2-2c for red and blue may be respectively formed of a total of three first electrodes, and unit color first electrodes Ag2-2 and Ag2-2c for green may be formed of a total of four first electrodes. In FIG. 6, c is added to the first electrode of each color such that the copy first electrode may be easily identified. For example, on the first electrode, the copy first electrode of red is shown as Rc, the copy first electrode of blue is shown as Bc, and the copy first electrode of green is shown as Gc. The copy first electrodes Ar2-2c, Ag2-2c, and Ab2-2c may be the first electrodes forming the copy light emitting element.

The main first electrodes Ar2-2, Ag2-2, and Ab2-2 and the copy first electrodes Ar2-2c, Ag2-2c, and Ab2-2c forming one unit color first electrode may be electrically connected with each other through copy connection wires TCLrc, TCLgc, and TCLbc.

The copy connection wires TCLrc, TCLgc, and TCLbc may be formed of a transparent conductive material or may be formed of the same material as the first electrode. In case that the copy connection wires TCLrc, TCLgc, and TCLbc are formed of a transparent conductive material, the area of the light transmissive area LTA of the 2-2 display area DA2-2 may be increased.

Although the transparent connection wires TCLr, TCLg, and TCLb and the copy connection wires TCLrc, TCLgc, and TCLbc are formed on different layers and overlap each other in a plan view, they may be electrically insulated from each other.

In FIG. 6, unit color first electrodes Ag2-2 and Ag2-2c for green and a copy connection wire TCLgc for green may be electrically connected in an n-shape, unit color first electrodes Ab2-2 and Ab2-2c for blue may be electrically connected through a copy connection wire TCLbc for blue, and may be electrically connected along the periphery of the green unit color first electrodes Ag2-2 and Ag2-2c, and unit color first electrodes Ar2-2 and Ar2-2c for red may be electrically connected through a copy connection wire TCLrc for red, formed over the adjacent two green unit color first electrodes Ag2-2 and Ag2-2c.

Depending on embodiments, the number of unit color first electrodes may be changed, and the disposition and connection structure of each color may be modified differently depending on embodiments.

As shown in FIG. 6, the position of one main first electrode that is directly connected with the transparent connection wires TCLr, TCLg, and TCLb in the adjacent first electrodes may be changed in the unit color first electrode.

In FIG. 6, although the transparent connection wires TCLr, TCLg, and TCLb are shown only in some regions, they may be further formed to be electrically connected to each first electrode in other regions. The portion where each first electrode is not formed may be the light transmissive area LTA in FIG. 6.

In the specification, an embodiment in which the main first electrodes Ar2-2, Ag2-2, and Ab2-2 are positioned in the 2-2 display area DA2-2 is described, but this is not restrictive. For example, the main first electrode may be the first electrode for the 2-1 display area formed in the 2-1 display area DA2-1, and the copy first electrode may be the first electrode for the 2-2 display area 2-2 electrically connected to the first electrode for the 2-1 display area.

Figure 7:
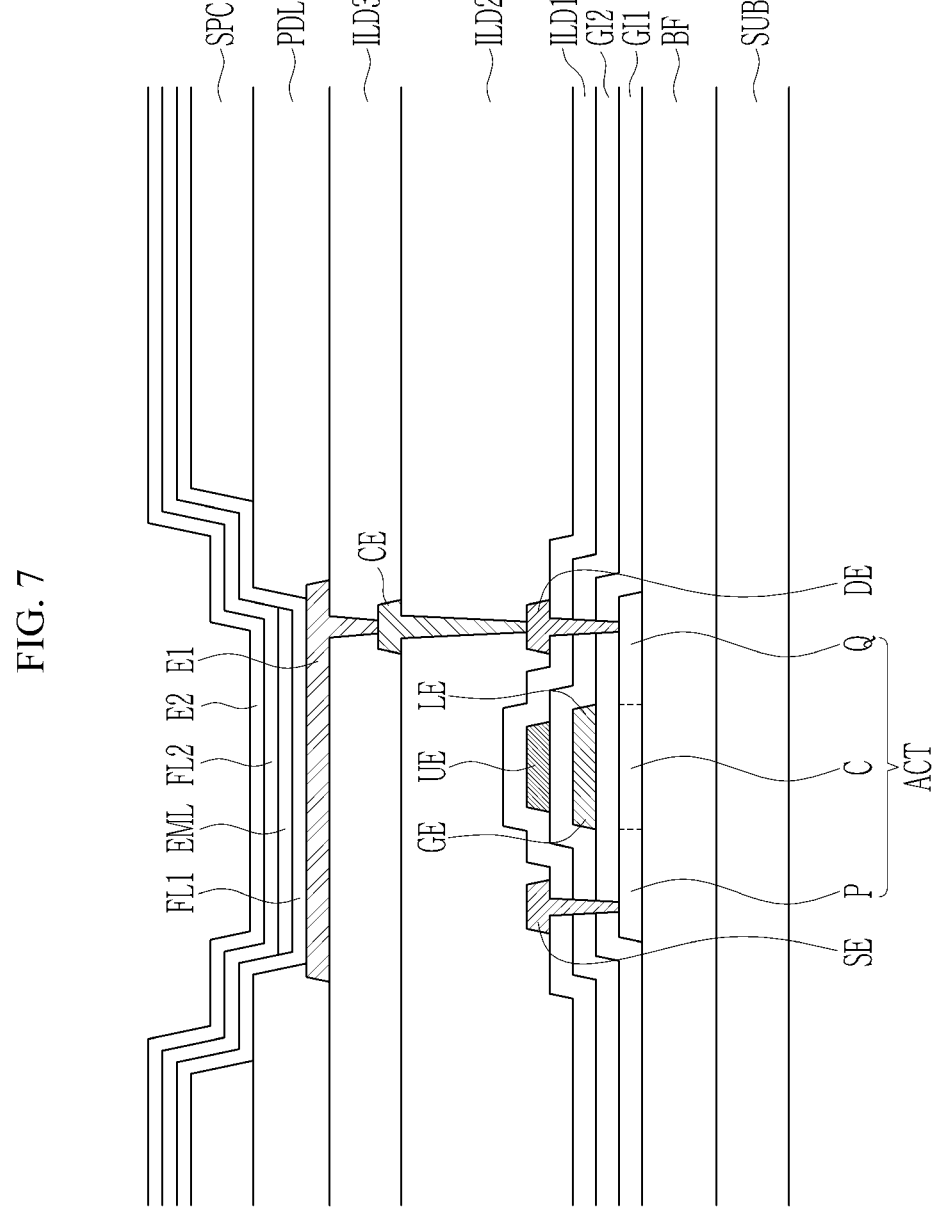
FIG. 7 is a schematic cross-sectional view of a first display area.
Figure 8:
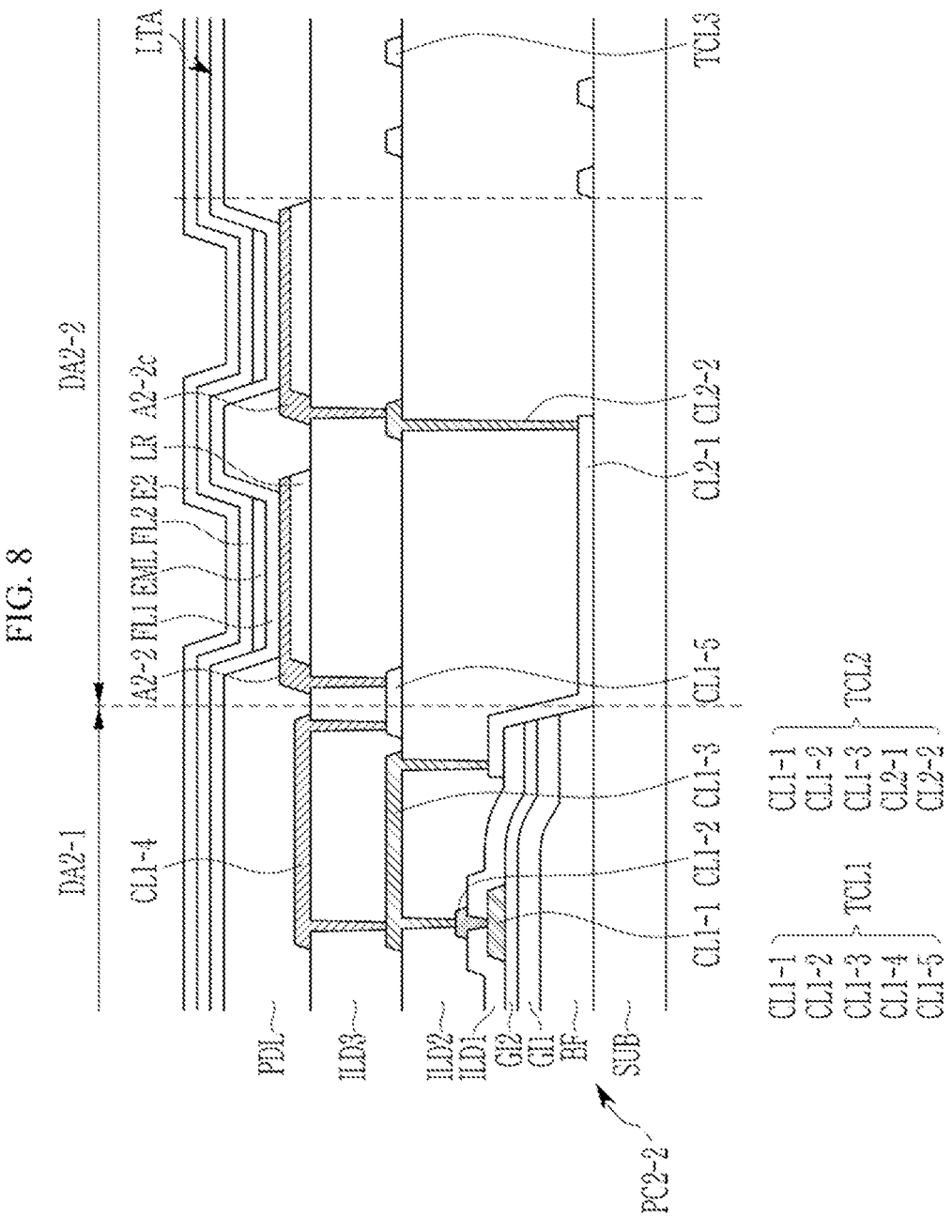
FIG. 8, FIG. 9, and FIG. 10 are schematic cross-sectional views of some area of the second display area.

Hereinafter, a schematic cross-sectional view of a display panel according to an embodiment will be described with reference to FIG. 7 and FIG. 8. FIG. 7 is a schematic cross-sectional view of a first display area, and FIG. 8 is a schematic cross-sectional view of a second display area.

Referring to FIG. 7, a first display area of a display panel will be described.

A display panel according to an embodiment may include a substrate SUB. The substrate SUB may include an inorganic insulating material such as glass or an organic insulating material such as plastic such as polyimide (PI). The substrate SUB may be single-layered or multi-layered. The substrate SUB may have a structure in which at least one base layer containing a sequentially stacked polymer resin and at least one inorganic layer are alternately stacked each other.

The substrate SUB may have various degrees of flexibility. The substrate SUB may be a rigid substrate or a flexible substrate capable of bending, folding, or rolling.

The buffer layer BF may be positioned on the substrate SUB. The buffer layer BF may block the transfer of impurities from the substrate SUB to an upper layer of the buffer layer BF, particularly, a semiconductor layer ACT, thereby preventing characteristic degradation of the semiconductor layer ACT and reducing stress. The buffer layer BF may include an inorganic insulating material such as a silicon nitride or a silicon oxide, or an organic insulating material. A part or all of the buffer layer BF may be omitted.

The semiconductor layer ACT may be positioned on the buffer layer BF. The semiconductor layer ACT may include at least one of polysilicon and an oxide semiconductor. The semiconductor layer ACT may include a channel area C, a first area P, and a second area Q. The first area P and the second area Q may be disposed on both sides of the channel area C, respectively. The channel area C may include a semiconductor doped with a small amount of an impurity or undoped with an impurity, and the first area P and the second area Q may include a semiconductor doped with a large amount of an impurity compared to the channel area C. The semiconductor layer ACT may be formed of an oxide semiconductor. A separate protective layer (not shown) may be added to protect the oxide semiconductor material, which may be vulnerable to external environments such as a high temperature.

A first gate insulation layer GI1 may be positioned on the semiconductor layer ACT. The first gate insulation layer GI1 may be a single layer or a multilayer including at least one of a silicon oxide ($SiO_x$), a silicon nitride ($SiN_x$), and a silicon oxynitride ($SiO_xN_y$).

A gate electrode GE and a lower electrode LE may be positioned on the first gate insulation layer GI1. Depending on embodiments, the gate electrode GE and the lower electrode LE may be integral with each other. The gate electrode GE and the lower electrode LE may be a single layer or a multilayer in which a metal film including any one of copper (Cu), a copper alloy, aluminum (Al), an aluminum alloy, molybdenum (Mo), a molybdenum alloy, titanium (Ti), and a titanium alloy is laminated. The gate electrode GE may overlap the channel area C of the semiconductor layer ACT in a plan view.

A second gate insulation layer GI2 may be positioned on the gate electrode GE and the first gate insulation layer GI1. The first gate insulation layer GI1 and the second gate insulation layer GI2 may be single layers or multilayers including at least one of a silicon oxide ($SiO_x$), a silicon nitride ($SiN_x$), and a silicon oxynitride ($SiO_xN_y$).

An upper electrode UE may be positioned on the second gate insulation layer GI2. The upper electrode UE may form a storage capacitor while overlapping the lower electrode LE.

A first interlayer insulation layer ILD1 may be positioned on the upper electrode UE. The first interlayer insulation layer ILD1 may be a single layer or multilayer including at least one of a silicon oxide ($SiO_x$), a silicon nitride ($SiN_x$), and a silicon oxynitride ($SiO_xN_y$).

A source electrode SE and the drain electrode DE may be positioned on the first interlayer insulation layer ILD1. The source electrode SE and the drain electrode DE may be respectively electrically connected to the first area P and the second area Q of the semiconductor layer ACT through a contact hole formed in the first interlayer insulation layer ILD1.

The source electrode SE and the drain electrode DE may contain aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may be a single layer or a multilayer including the same.

A second interlayer insulation layer ILD2 may be positioned on the first interlayer insulation layer ILD1, the source electrode SE, and the drain electrode DE. The second interlayer insulation layer ILD2 may include an organic insulating material such as general-purpose polymers such as polymethylmethacrylate (PMMA) or polystyrene (PS), polymer derivatives with phenolic groups, acryl-based polymers, imide-based polymers, polyimides, acryl-based polymers, siloxane-based polymers, and the like. Although it is described that the second interlayer insulation layer ILD2 is formed as a single layer in the specification, it is not limited thereto and may be formed of multiple layers.

A connection electrode CE may be positioned on the second interlayer insulation layer ILD2. The connection electrode CE may be positioned between the first electrode E1 and the drain electrode DE, and depending on embodiments, the first electrode E1 and the drain electrode DE may be electrically connected.

A third interlayer insulation layer ILD3 may be positioned on the connection electrode CE. A first electrode E1 may be positioned on the third interlayer insulation layer ILD3. The first electrode E1 may be electrically connected to the drain electrode DE through a contact hole of the third interlayer insulation layer ILD3 and the second interlayer insulation layer ILD2.

The first electrode E1 may include a metal such as silver (Ag), lithium (Li), calcium (Ca), aluminum (Al), magnesium (Mg), or gold (Au), and may include a transparent conductive oxide (TCO) such as an indium tin oxide (ITO), an indium zinc oxide (IZO), and the like. The first electrode E1 may be formed of a single layer including a metallic material or a transparent conductive oxide, or a multi-layer including these. For example, the first electrode E1 may have a triple layer structure of indium tin oxide (ITO)/silver (Ag)/indium tin oxide (ITO).

A transistor formed of the gate electrode GE, the semiconductor layer ACT, the source electrode SE, and the drain electrode DE may be electrically connected to the first electrode E1 to supply a current to the light emitting element.

A partitioning wall or a bank PDL may be positioned on the third interlayer insulation layer ILD3 and the first electrode E1.

The bank PDL may overlap at least a portion of the first electrode E1 and may have an opening defining a light emitting area. The opening may have a planar shape substantially similar to that of the first electrode E1. The opening may have a planar circular shape, but is not limited thereto, and may have any shape such as a rhombus or an octagonal shape similar to a rhombus, a quadrangle, a polygon, or an ellipse.

The bank PDL may contain an organic insulator. In other embodiments, the bank PDL may include an inorganic insulating material such as a silicon nitride, a silicon oxynitride, or a silicon oxide. In other embodiments, the bank PDL may include an organic insulator and an inorganic insulator. In an embodiment, the bank PDL may contain a light blocking material and may be provided in black. The light blocking material may include carbon black, carbon nanotubes, a resin containing a black dye or paste, metal particles, for example, nickel, aluminum, molybdenum, and an alloy thereof, metal oxide particles (e.g., a chromium oxide) or metal nitride particles (e.g., a chromium nitride), and the like. In case that the bank PDL contains a light blocking material, reflection of external light by the metal structures disposed under the bank PDL may be reduced. However, the disclosure is not limited thereto. In another embodiment, the bank PDL may not contain a light blocking material, but may contain a light-transmitting organic insulator.

A spacer SPC may be disposed on the bank PDL. The spacer SPC may contain an organic insulator such as a polyimide. In other embodiments, the spacer SPC may include an inorganic insulating material such as a silicon nitride ($SiN_x$) or a silicon oxide ($SiO_2$), or may include an organic insulator and an inorganic insulating material.

In the embodiment, the spacer SPC and the bank PDL may include the same material. The bank PDL and the spacer SPC may be formed together in a mask process using a halftone mask or the like. In the embodiment, the bank PDL and the spacer SPC may contain different materials.

An emission layer EML may be positioned on the first electrode E1. The emission layer EML may contain organic and/or inorganic materials. The emission layer EML may generate light of a color. The emission layer EML may be formed to be disposed only within an opening of the bank using a mask or inkjet process.

A first function layer FL1 may be positioned between the emission layer EML and the first electrode E1, and a second function layer FL2 may be positioned between the emission layer EML and the second electrode E2.

The first function layer FL1 may include at least one of a hole injection layer (HIL) and a hole transport layer (HTL), and the second function layer FL2 may include at least one of an electron transport layer (ETL) and an electron injection layer (EIL).

The emission layer EML may be disposed in each pixel to correspond to the opening of the bank PDL, but the first function layer FL1 and the second function layer FL2 may be integral with each other to cover an entire surface of the substrate SUB. In other words, the first function layer FL1 and the second function layer FL2 may be integral with each other to completely cover the display area DA of the substrate SUB, respectively. The first function layer FL1 and the second function layer FL2 may be continuously formed over the first display area DA1, the 2-1 display area DA2, and the 2-2 display area DA2.

The second electrode E2 may be positioned on the emission layer EML. The second electrode E2 may include reflective metal including calcium (Ca), barium (Ba), magnesium (Mg), aluminum (Al), silver (Ag), gold (Au), nickel (Ni), chromium (Cr), lithium (Li), calcium (Ca), molybdenum (Mo), and the like, or a transparent conductive oxide (TCO) such as an indium tin oxide (ITO) or an indium zinc oxide (IZO).

The first electrode E1, the emission layer EML, and the second electrode E2 may form a light emitting element ED. Holes and electrons may be injected into the emission layer EML, respectively, from the first electrode E1 and the second electrode E2, and light emission may occur in case that the excitons combined with the injected holes and electrons fall from an exited state to a ground state.

Hereinafter, a schematic cross-sectional view of the second display area will be described with reference to FIG. 8 together with FIG. 4 to FIG. 6. FIG. 8 illustrates a schematic cross-sectional structure of the 2-1 display area DA2-1 and the 2-2 display area DA2-2, and a schematic cross-sectional structure of a light transmissive area LTA in which the first electrode is not positioned in the display area DA2-2 is also illustrated.

FIG. 8 schematically illustrates a cross-sectional structure of the 2-1 display area DA2-1. A pixel circuit portion positioned in the 2-1 display area DA2-1 may be the same as the cross-sectional structure of the pixel circuit portion shown in FIG. 7, and thus it is omitted in FIG. 8.

In the 2-1 display area DA2-1, a buffer layer BF may be positioned on a substrate SUB, and a first gate insulation layer GI1, a second gate insulation layer GI2, a first interlayer insulation layer ILD1, a second interlayer insulation layer ILD2, a third interlayer insulation layer ILD3, and a bank PDL may be sequentially positioned on the buffer layer BF. In the 2-2 display area DA2-2, the second interlayer insulation layer ILD2, the third interlayer insulation layer ILD3, and the bank PDL may be positioned on the substrate SUB. The buffer layer BF, the first gate insulation layer GI1, the second gate insulation layer GI2, and the first interlayer insulation layer ILD1 may be omitted in the 2-2 display area DA2-2, but this is not restrictive.

In the embodiment of FIG. 8, connection wires TCL1 and TCL2 that electrically connect a pixel circuit portion PC2-2 for the 2-2 display area positioned in the 2-1 display area DA2-1 and first electrodes A2-2 and A2-2c for the 2-2 display area DA2-2 may be positioned.

In the embodiment of FIG. 8, an output current of a pixel circuit portion PC2-2 for the 2-2 display area of the 2-1 display area DA2-1 may be transmitted to a first electrode A2-2 for the 2-2 display area. In other embodiments, an output current of a pixel circuit portion PC2-2 for the 2-1 display area DA2-1 may be transmitted to a first electrode A2-2c for the 2-2 display area through a second connection wire TCL2.

The first connection wire TCL1 may include a 1-1 connection portion CL1-1 disposed between the second gate insulation layer GI2 and the first interlayer insulation layer ILD1, a 1-2 connection portion CL1-2 disposed between the first interlayer insulation layer ILD1 and the second interlayer insulation layer ILD2, a 1-3 connection portion CL1-3 disposed between the second interlayer insulation layer ILD2 and the third interlayer insulation layer ILD3, a 1-4 connection portion CL1-4 disposed between the third interlayer insulation layer ILD3 and the bank PDL, and a 1-5 connection portion CL1-5 disposed throughout the 2-1 display area DA2-1 and the 202-display area DA2-2 while being disposed between the second interlayer insulation layer ILD2 and the third interlayer insulation layer ILD3 in the 2-1 display area DA2-1. The 1-1 connection portion CL1-1 may include the same material as the upper electrode UE and may be formed in the same process as the upper electrode UE, and the 1-2 connection portion CL1-2 may include the same material as the source electrode SE and the drain electrode DE and may be formed in the same process as the source electrode SE and the drain electrode DE. The 1-3 connection portion CL1-3 may include the same material as the connection electrode CE and may be formed in the same process as the connection electrode CE, and the 1-4 connection portion CL1-4 may include the same material as the first electrode E1 and may be formed in the same process as the first electrode E1. The 1-5 connection portion CL1-5 may include a transparent conductive oxide (TCO) such as an indium tin oxide (ITO) or an indium zinc oxide (IZO). The 1-5 connection portion CL1-5 may include a different material from that of the 1-3 connection portion CL1-3 positioned on the same layer, and may be formed through a separate process.

The second connection wire TCL2 may include a 1-1 connection portion CL1-1 disposed between the second gate insulation layer GI2 and the first interlayer insulation layer ILD1, a 1-2 connection portion CL1-2 disposed between the first interlayer insulation layer ILD1 and the second interlayer insulation layer ILD2, a 1-3 connection portion CL1-3 disposed between the second interlayer insulation layer ILD2 and the third interlayer insulation layer ILD3, a 2-1 connection portion CL2-1 disposed throughout the 2-1 display area DA2-1 and the 2-2 display area DA2-2, and a 2-2 connection portion CL2-2 disposed in the 2-2 display area DA2-2 while being disposed between the second interlayer insulation layer ILD2 and the third interlayer insulation layer ILD3 in the 2-1 display area DA2-1. The 2-1 connection portion CL2-1 may be disposed between the first interlayer insulation layer ILD1 and the second interlayer insulation layer ILD2 in the 2-1 display area DA2-1, and may be disposed between the substrate SUB and the second interlayer insulation layer ILD2 in the 2-2 display area DA2-2. Here, the 2-1 connection portion CL2-1 may include a transparent conductive oxide (TCO) such as an indium tin oxide (ITO) or an indium zinc oxide (IZO). The 2-2 connection portion CL2-2 may include the same material as the above-described connection electrode CE, and may be formed in the same process.

Depending on embodiments, the 1-1 connection portion CL1-1, the 1-2 connection portion CL1-2, the 1-3 connection portion CL1-3, and the 1-4 connection portion CL1-4 disposed in the 2-1 display area DA2-1 may include opaque metal. The 1-5 connection portion CL1-5 and the 2-1 connection portion CL2-1 that are disposed throughout from the 2-1 display area DA2-1 to the 2-2 display area DA2-2 may include a transparent conductive oxide. Depending on embodiments, the 2-2 connection portion CL2-2 may include transparent conductive oxide or opaque metal.

The first electrode A2-2 for the 2-2 display area may be electrically connected with the 1-5 connection portion CL1-5, and the other first electrode A2-2c for the 2-2 display area may be electrically connected with the 2-2 connection portion CL2-2. In the specification, the embodiment in which the light emitting element and the pixel circuit portion are electrically connected through the first connection wire TCL1 and the second connection wire TCL2 has been described and illustrated, but this is not restrictive. The pixel circuit portion for the 2-2 display area disposed in the 2-1 display area and the light emitting element for the 2-2 display area disposed in the 2-2 display area may be electrically connected through various connection methods.

A partitioning wall or bank PDL that includes an opening exposing at least a part of the first electrodes A2-2 and A2-2c for the 2-2 display area may be positioned on the first electrodes A2-2 and A2-2c for the 2-2 display area. As described in the first display area DA1, the first function layer FL1, the emission layer EML, the second function layer FL2, and the second electrode E2 may be sequentially stacked on the bank PDL in the first display area DA1.

A low reflective layer LR may be disposed between first electrodes A2-2 and A2-2c for the 2-2 display area and a third interlayer insulation layer ILD3. The low reflective layer LR according to the embodiment may contact (e.g., directly contact) the first electrodes A2-2 and A2-2c for the 2-2 display area. In particular, the low reflective layer LR may contact (e.g., directly contact) the bottom surfaces of the first electrodes A2-2 and A2-2c for the 2-2 display area. However, the disclosure is not limited thereto, and an insulation layer may be positioned between the low reflective layer LR and the first electrodes A2-2 and A2-2c for the 2-2 display area according to another embodiment.

The low reflective layer LR may have a smaller area than the first electrodes A2-2 and A2-2c for the 2-2 display area. Depending on embodiments, an edge of the low reflective layer LR may overlap edges of the first electrodes A2-2 and A2-2c for the 2-2 display area in a plan view. A planar shape of the low reflective layer LR may be substantially equivalent to planar shapes of the first electrodes A2-2 and A2-2c for the 2-2 display area, but is not limited thereto.

A thickness of the low reflective layer LR may be about 50 angstroms to about 800 angstroms. In case that the thickness of the low reflective layer LR is less than 50 angstroms, effective reflection reduction may be difficult, and in case that the thickness of the low reflective layer LR exceeds about 800 angstroms, the problem of excessively thickening the thickness of the constituent elements may occur.

The reflectance of the low reflective layer LR may be lower than that of the first electrodes A2-2 and A2-2c for the 2-2 display area. The low reflective layer LR may contain a material with low light reflectance, and thus light may be reflected from the first electrodes A2-2 and A2-2c for the 2-2 display area and may be incident on the optical element, and thus an unintended pattern may be prevented from being viewed.

A reflectance n of the first electrodes A2-2 and A2-2c for the 2-2 display area may be greater than a reflectance n of the low reflective layer LR. The reflectance n of the first blocking layer BL1 and the first electrodes A2-2 and A2-2c for the 2-2 display area may be measured in a visible light region, for example, light in a wavelength range of about 380 nm to about 780 nm as a reference.

The low reflective layer LR may include metal or metal oxide, inorganic material, amorphous silicon, and the like. The inorganic material may include silicon oxide, silicon nitride, silicon oxynitride, and the like.

In case that the low reflective layer LR may include a metal or a metal oxide, the metal may be molybdenum, and the metal oxide may be a molybdenum oxide. Depending on embodiments, the low reflective layer LR may include a molybdenum oxide containing a metal impurity. The low reflective layer LR may include tantalum or titanium in a molybdenum oxide.

In other embodiments, the low reflective layer LR may include molybdenum tantalum oxide (MoTaO$_x$) or molybdenum titanium oxide (MoTiO$_x$). Since tantalum or titanium is included in molybdenum oxide, it is possible to maintain the optical characteristic of the low reflective layer LR even after a high temperature process by increasing the heat resistance characteristic of the low reflective layer LR.

The low reflective layer LR may include molybdenum tantalum oxide (MoTaO$_x$), and a tantalum content in the low reflective layer LR may be about 8 wt % or more. The low reflective layer LR may be molybdenum tantalum oxide (MoTaO$_x$), and in case that the tantalum content in the low reflective layer LR is about 8 wt % or more, the optical characteristic of the low reflective layer LR may be maintained even after a high temperature process at about 450° C.

The low reflective layer LR may include molybdenum titanium oxide (MoTiO$_x$), and a titanium content in the low reflective layer LR may be about 50 wt %. The low reflective layer LR may include molybdenum titanium oxide (MoTiO$_x$), and in case that the titanium content in the low reflective layer LR is about 50 wt %, the optical characteristic of the low reflective layer LR may be maintained even after a high temperature process at about 450° C.

Referring to FIG. 8, a light transmissive area LTA may include a substrate SUB, a second interlayer insulation layer ILD2, a third interlayer insulation layer ILD3, and a bank PDL. A connection wire TCL3 formed of a transparent conductive material may be positioned between the substrate SUB and the second interlayer insulation layer ILD2, or between the second interlayer insulation layer ILD2 and the third interlayer insulation layer ILD3.

Figure 9:
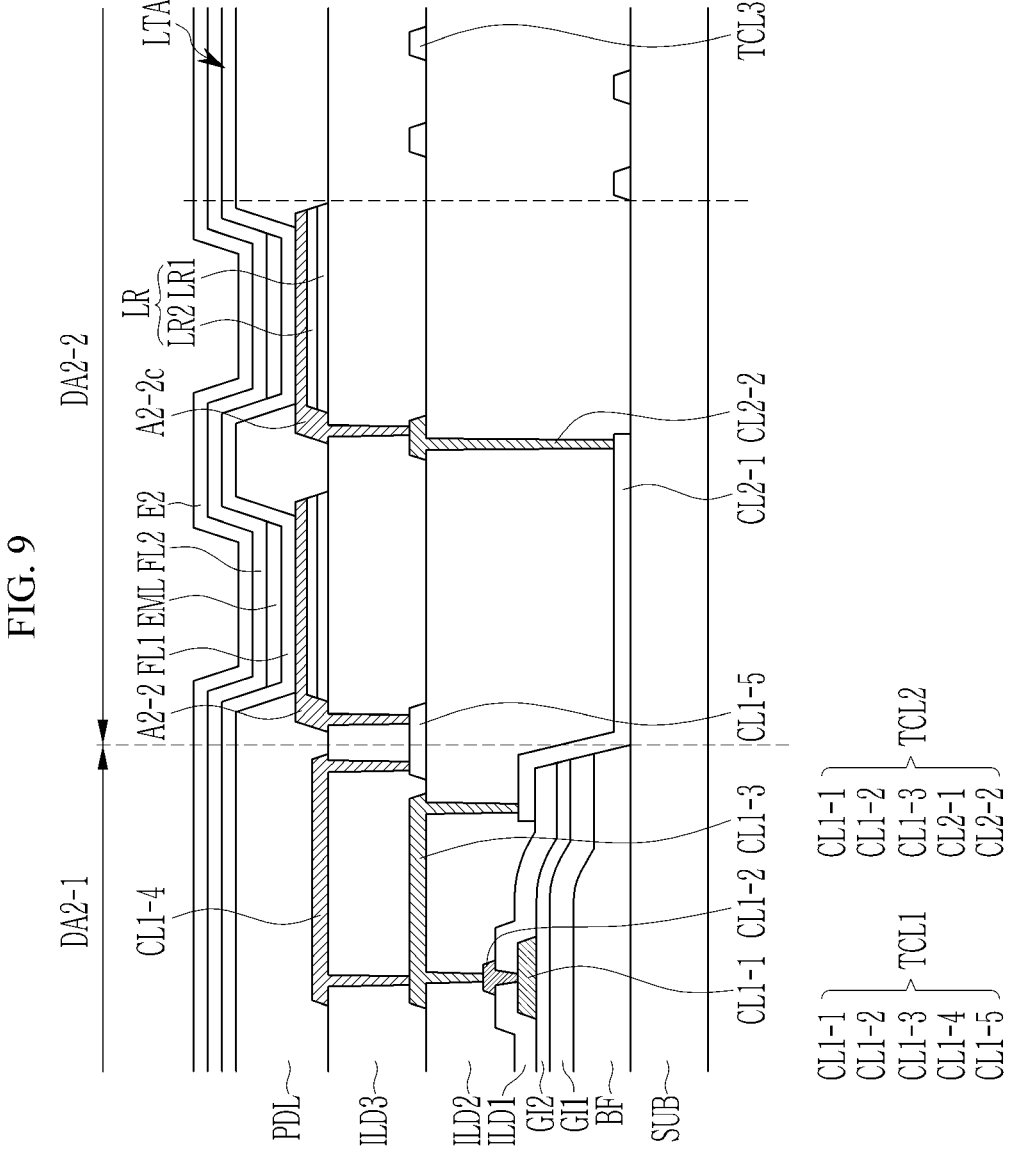
Figure 10:
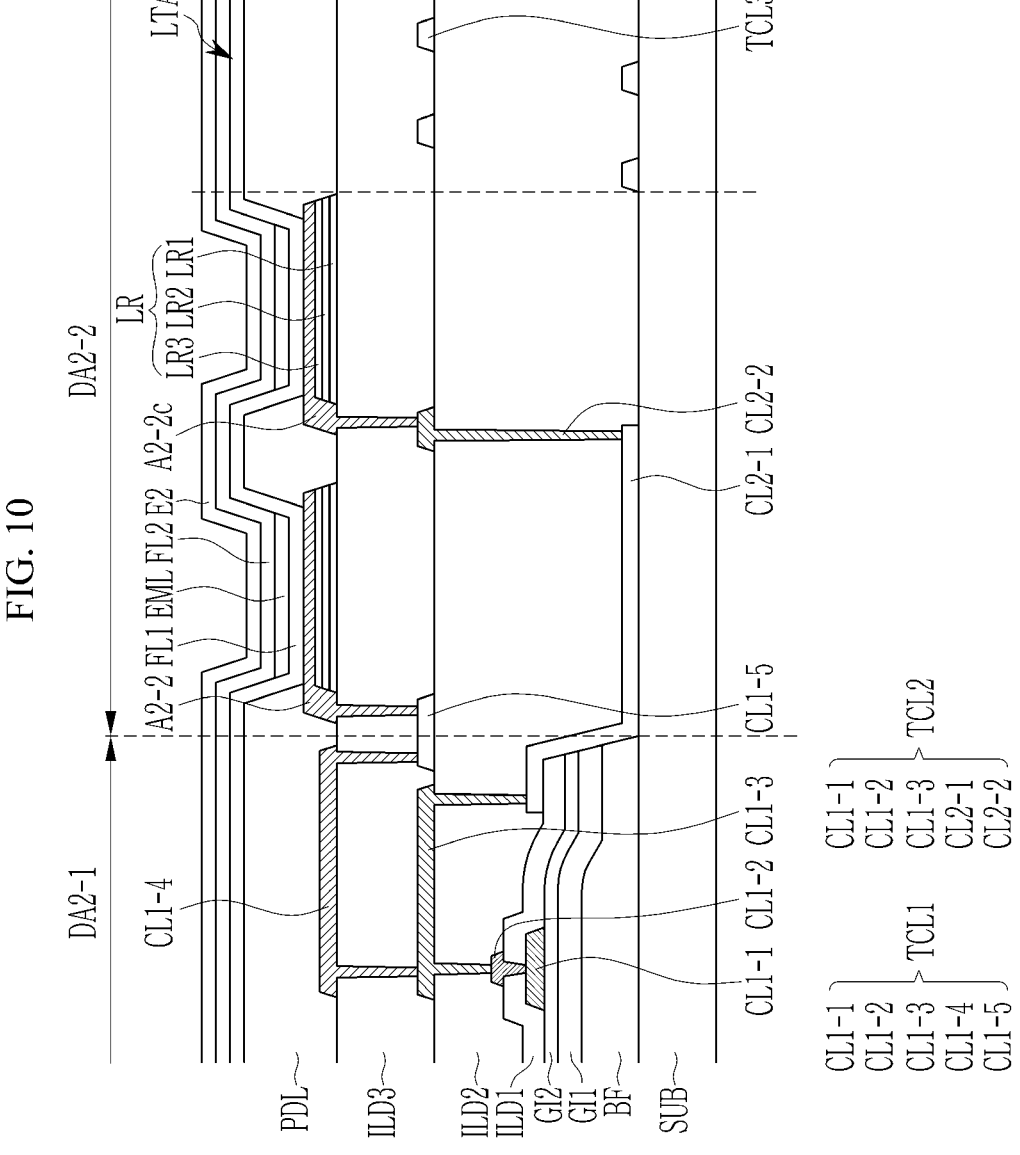

Hereinafter, low reflective layers according to other embodiments will be described respectively with reference to FIG. 9 and FIG. 10. FIG. 9 and FIG. 10 are schematic cross-sectional views of some areas of a second display area.

A description of constituent elements that are the same as the above-described constituent elements will be omitted.

Referring to FIG. 9, a low reflective layer LR according to an embodiment may include a first sub-low reflective layer LR1 positioned on a third interlayer insulation layer ILD3, and a second sub-low reflective layer LR2 positioned on the first sub-low reflective layer LR1.

A thickness of the first sub-low reflective layer LR1 may be about 10 angstroms to 700 angstroms, and a thickness of the second sub-low reflective layer LR2 may be about 50 angstroms to about 800 angstroms. In case that the thickness of the first sub-low reflective layer LR1 and the thickness of the second sub-low reflective layer LR2 are less than the stated range, effective reflection reduction may not be achieved, and in case that the thickness of the first sub-low reflective layer LR1 and the thickness of the second sub-low reflective layer LR2 exceed the stated range, a problem that the thickness of constituent elements becomes excessively thick may occur.

Depending on embodiments, each of the first sub-low reflective layer LR1 and the second sub-low reflective layer LR2 may include metal or metal oxide, inorganic material, amorphous silicon, and the like. The inorganic material may include silicon oxide, silicon nitride, silicon oxynitride, and the like.

Each of the first sub-low reflective layer LR1 and the second sub-low reflective layer LR2 may independently include metal or metal oxide, the metal may be molybdenum, and the metal oxide may be a molybdenum oxide.

In other embodiments, each of the first sub-low reflective layer LR1 and the second sub-low reflective layer LR2 may include molybdenum tantalum oxide (MoTaO$_x$) or molybdenum titanium oxide (MoTiO$_x$). The heat resistance characteristic of the low reflective layer LR may be increased by including tantalum or titanium in the molybdenum oxide, and the optical characteristic of the low reflective layer LR may be maintained even after a high temperature process.

According to an embodiment, the first sub-low reflective layer LR1 may include amorphous silicon, and the second sub-low reflective layer LR2 may include a silicon oxide. In other embodiments, the first sub-low reflective layer LR1 may include molybdenum, and the second sub-low reflective layer LR2 may include a silicon oxide.

Referring to FIG. 10, a low reflective layer LR according to an embodiment may include a first sub-low reflective layer LR1 positioned on a third interlayer insulation layer ILD3, a second sub-low reflective layer LR2 positioned on the first sub-low reflective layer LR1, and a third sub-low reflective layer LR3 positioned on the second sub-low reflective layer LR2.

A thickness of the first sub-low reflective layer LR1 may be about 10 angstroms to about 700 angstroms, a thickness of the second sub-low reflective layer LR2 may be about 50 angstroms to about 800 angstroms, and a thickness of the third sub-low reflective layer LR3 is about 50 angstroms to about 300 angstroms. In case that the thickness of the first sub-low reflective layer LR1, the second sub-low reflective layer LR2, and the third sub-low reflective layer LR3 is less than the above-stated range, effective reflection reduction may not be achieved, and in case that the thickness of the first sub-low reflective layer LR1, the thickness of the second sub-low reflective layer LR2, and the thickness of the third sub-low reflective layer LR3 exceed the above-stated range, a problem that the thickness of the constituent elements becomes excessively thick may occur.

Depending on embodiments, the first sub-low reflective layer LR1, the second sub-low reflective layer LR2, and the third sub-low reflective layer LR3 may independently include metal or metal oxide, inorganic material, amorphous silicon, and the like. The inorganic material may include silicon oxide, silicon nitride, silicon oxynitride, and the like.

The first sub-low reflective layer LR1, the second sub-low reflective layer LR2, and the third sub-low reflective layer LR3 may independently include metal or metal oxide, and the metal may be molybdenum, or the metal oxide may be molybdenum oxide.

In other embodiments, each of the first sub-low reflective layer LR1, the second sub-low reflective layer LR2, and the third sub-low reflective layer LR3 may include molybdenum tantalum oxide (MoTaO$_x$) or molybdenum titanium oxide (MoTiO$_x$). The heat resistance characteristic of the low reflective layer LR may be increased by including tantalum or titanium in the molybdenum oxide, and the optical characteristic of the low reflective layer LR may be maintained even after a high temperature process.

According to an embodiment, the first sub-low reflective layer LR1 may include a silicon nitride, the second sub-low reflective layer LR2 may include silicon oxide, and the third sub-low reflective layer LR3 may include amorphous silicon.

Figure 11:
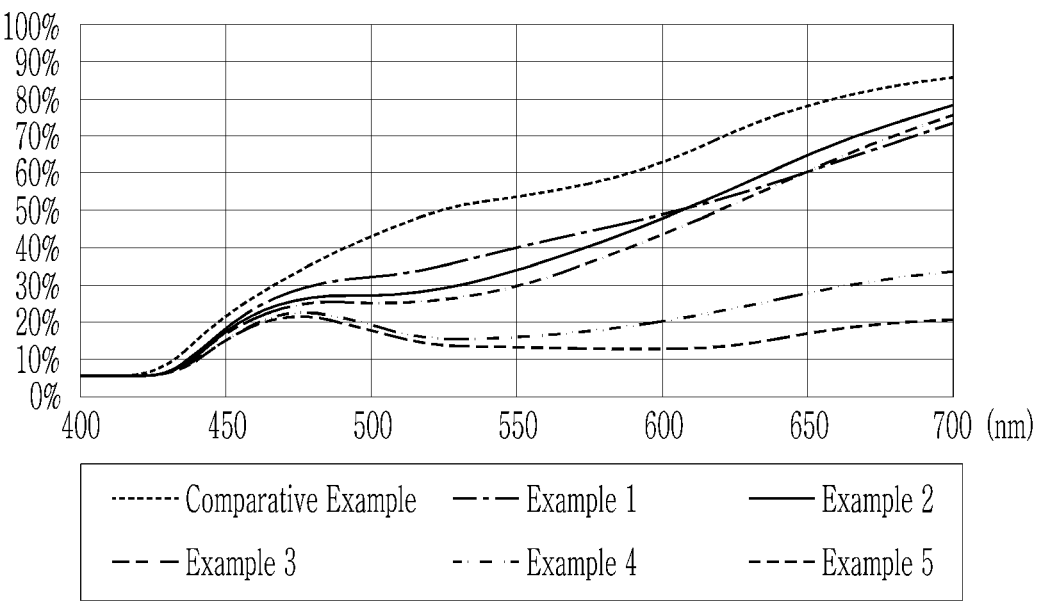
FIG. 11 is a graph illustrating reflectance by wavelength according to embodiments and a comparative example.

Hereinafter, referring to FIG. 11, reflectance of a lower portion of a display panel according to embodiments and a comparative example will be described. FIG. 11 is a graph illustrating reflectance by wavelength according to embodiments and a comparative example.

The comparative example has a structure without a low reflection layer, and Embodiment 1 has a structure including a low reflection layer containing amorphous silicon having a thickness of 200 angstroms. Embodiment 2 has a structure including a first sub-low reflective layer including amorphous silicon having a thickness of 100 angstroms and a second sub-low reflective layer including silicon oxide having a thickness of 130 angstroms. Embodiment 3 has a structure in which a first sub-low reflective layer containing silicon nitride with a thickness of 400 angstroms, a second sub-low reflective layer containing silicon oxide with a thickness of 150 angstroms, and a third sub-low reflective layer containing amorphous silicon with a thickness of 150 angstroms. Embodiment 4 has a structure including a first sub-low reflective layer containing molybdenum with a thickness of 50 angstroms, and a second sub-low reflective layer containing silicon oxide with a thickness of 500 angstroms. Embodiment 5 has a structure including a low-reflection layer containing MTO with a thickness of 500 angstroms.

wavelength band between blue light and green light, a green light wavelength band, a wavelength band between green light and red light, and a red light wavelength band. For example, an average reflectance of the display panel according to the comparative example was 50.25% in the wavelength range of 400 nanometers to 700 nanometers, 39.64% in Embodiment 1, 38.47% in Embodiment 2, 35.84% in Embodiment 3, 19.40% in Embodiment 4, and 14.74% in Embodiment 5.

The display device according to the embodiments including a low-reflection layer may reduce reflection in the 2-2 display area, and thus light may be reflected from the first electrode and may be incident on the optical element, thereby preventing the occurrence of a reflective pattern. Therefore, it is possible to provide a display device with improved display quality.

While this disclosure has been described in connection with what is considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A display device comprising:
a first display area that comprises:
  a first pixel circuit portion; and
  a first light emitting element electrically connected with the first pixel circuit portion;
a 2-1 display area that comprises:
  a 2-1 pixel circuit portion;
  a 2-1 light emitting element electrically connected with the 2-1 pixel circuit portion; and
  a 2-2 pixel circuit portion; and
a 2-2 display area that comprises:
  a 2-2 light emitting element electrically connected with the 2-2 pixel circuit portion; and
  a light transmissive area, wherein
    the first pixel circuit portion of the first display area is disposed lower than the first light emitting element in a cross-sectional view,
    the 2-1 pixel circuit portion of the 2-1 display area is disposed lower than the 2-1 light emitting element in a cross-sectional view,
    the 2-2 light emitting element comprises:
      a first electrode disposed in the 2-2 display area;
      an emission layer disposed in the 2-2 display area; and

TABLE 1

| | Comparative Example | Embodiment 1 | Embodiment 2 | Embodiment 3 | Embodiment 4 | Embodiment 5 |
|---|---|---|---|---|---|---|
| Average | 50.25% | 39.64% | 38.47% | 35.84% | 19.40% | 14.74% |
| B | 21.51% | 17.89% | 16.64% | 16.27% | 15.11% | 14.95% |
| BG | 42.95% | 32.29% | 27.10% | 25.07% | 18.82% | 17.98% |
| G | 53.41% | 40.21% | 33.96% | 30.29% | 15.97% | 13.75% |
| GR | 62.69% | 49.37% | 47.86% | 43.62% | 20.28% | 12.78% |
| R | 77.59% | 60.43% | 64.71% | 60.80% | 27.57% | 16.63% |

As shown in Table 1 and FIG. 11, as a result of examining the average reflectance of the wavelength band from 400 nanometers to 700 nanometers, the reflectance according to the comparative example was the highest, and the reflectance decreased in the order of Embodiment 1, Embodiment 2, Embodiment 3, Embodiment 4, and Embodiment 5. Such a result was the same in a blue light wavelength band, a a second electrode disposed in the 2-2 display area, and the 2-2 display area comprises a low reflective layer that overlaps the first electrode disposed in the 2-2 display area in a plan view, wherein the low reflective layer is disposed only in the 2-2 display area and is spaced apart from the first light emitting element and the 2-1 light emitting element, and wherein the low reflective layer includes at least one of the molybdenum, molybdenum oxide, molybdenum tantalum oxide, molybdenum titanium oxide, and amorphous silicon.

2. The display device of claim 1, wherein the low reflective layer contacts the first electrode.

3. The display device of claim 2, wherein the low reflective layer contacts a bottom surface of the first electrode.

4. The display device of claim 1, wherein a reflectance of the low reflective layer is lower than a reflectance of the first electrode.

5. The display device of claim 1, wherein a thickness of the low reflective layer is in a range of about 50 angstroms to about 800 angstroms.

6. The display device of claim 1, wherein the low reflective layer comprises a first sub-low reflective layer and a second sub-low reflective layer that are sequentially stacked each other.

7. The display device of claim 6, wherein the low reflective layer further comprises a third sub-low reflective layer disposed on the second sub-low reflective layer.

8. The display device of claim 7, wherein a thickness of the first sub-low reflective layer is in a range of about 10 angstroms to about 700 angstroms, and a thickness of the second sub-low reflective layer is in a range of about 50 angstroms to about 800 angstroms.

9. The display device of claim 8, wherein a thickness of the third sub-low reflective layer is in a range of about 50 angstroms to about 300 angstroms.

10. The display device of claim 1, wherein the 2-2 pixel circuit portion and the first electrode are electrically connected through a transparent connection wire.

11. The display device of claim 10, wherein the transparent connection wire is disposed throughout the 2-1 display area and the 2-2 display area.

12. The display device of claim 1, wherein each of the first light emitting element, the 2-1 light emitting element, and the 2-2 light emitting element comprises a function layer disposed between the first electrode and the second electrode, and the function layer is disposed throughout the first display area, the 2-1 display area, and the 2-2 display area.

13. The display device of claim 1, wherein the lower reflective layer comprises: an upper planar surface directly contacting a planar surface of the first electrode; and a first end of the low reflective layer directly contacting a bank layer, the bank layer and the low reflective layer being on an insulating layer.

14. The display device of claim 1, wherein the low reflective layer comprises:

a first end and a second end spaced apart by a lower planar surface directly contacting an insulating layer, the lower planar surface coplanar with a lower surface of the first electrode at the first end of the low reflective layer in the cross-sectional view.

15. A display device comprising:

a first display area that comprises:

a first pixel circuit portion; and a first light emitting element electrically connected with the first pixel circuit portion;

a 2-1 display area that comprises:

a 2-1 pixel circuit portion;

a 2-1 light emitting element electrically connected with the 2-1 pixel circuit portion; and a 2-2 pixel circuit portion; and a 2-2 display area that comprises:

a 2-2 light emitting element electrically connected with the 2-2 pixel circuit portion;

a light transmissive area; and a low reflective layer, wherein the 2-2 light emitting element comprises a first electrode, an emission layer, and a second electrode, and a reflectance of the low reflective layer is lower than a reflectance of the first electrode, and wherein the low reflective layer is disposed only in the 2-2 display area and is spaced apart from the first light emitting element and the 2-1 light emitting element, and wherein the low reflective layer includes at least one of the molybdenum, molybdenum oxide, molybdenum tantalum oxide, molybdenum titanium oxide, and amorphous silicon.

16. The display device of claim 15, wherein the 2-2 display area further comprises:

a substrate;

an interlayer insulation layer extended from the 2-1 display area; and a transparent connection wire that is disposed on the interlayer insulation layer.

17. The display device of claim 15, wherein the low reflective layer comprises a first sub-low reflective layer and a second sub-low reflective layer that are sequentially stacked each other.

18. The display device of claim 17, wherein the low reflective layer further comprises a third sub-low reflective layer that is disposed on the second sub-low reflective layer.

* * * * *